United States Patent
Lee et al.

(10) Patent No.: US 11,895,791 B2
(45) Date of Patent: Feb. 6, 2024

(54) DISPLAY DEVICE

(71) Applicant: LG Display Co., Ltd., Seoul (KR)

(72) Inventors: JaeSung Lee, Paju-si (KR); Jaehyeong Kim, Paju-si (KR); Dojin Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/541,988

(22) Filed: Dec. 3, 2021

(65) Prior Publication Data

US 2022/0210934 A1    Jun. 30, 2022

(30) Foreign Application Priority Data

Dec. 24, 2020  (KR) .................. 10-2020-0183010

(51) Int. Cl.
*H05K 5/02* (2006.01)
*G06F 1/16* (2006.01)

(52) U.S. Cl.
CPC ......... *H05K 5/0217* (2013.01); *G06F 1/1652* (2013.01)

(58) Field of Classification Search
CPC .. H05K 5/0017; H05K 5/0217; G06F 1/1652; G09F 9/301
See application file for complete search history.

(56) References Cited

U.S. PATENT DOCUMENTS

| | | | | |
|---|---|---|---|---|
| 6,297,905 B1 * | 10/2001 | Takamoto | ............... | G03B 21/58 |
| | | | | 359/461 |
| 7,602,549 B2 * | 10/2009 | Yamauchi | ............... | G03B 21/56 |
| | | | | 359/461 |
| 9,823,697 B2 * | 11/2017 | Hsu | ............... | G06F 1/1624 |
| 10,314,183 B2 * | 6/2019 | Heo | ............... | H05K 5/0217 |
| 2013/0058063 A1 * | 3/2013 | O'Brien | ............... | G06F 1/1624 |
| | | | | 361/807 |
| 2016/0320804 A1 * | 11/2016 | Takayanagi | ........... | G06F 1/1679 |
| 2017/0013726 A1 * | 1/2017 | Han | ............... | H05K 5/0217 |
| 2017/0023978 A1 * | 1/2017 | Cho | ............... | G06F 1/1656 |
| 2017/0123536 A1 * | 5/2017 | Aurongzeb | ......... | H04M 1/0241 |
| 2017/0196102 A1 * | 7/2017 | Shin | ............... | G06F 1/1652 |
| 2017/0344073 A1 * | 11/2017 | Kang | ............... | G09F 9/301 |
| 2018/0103551 A1 * | 4/2018 | Park | ............... | H05K 5/0217 |
| 2018/0359869 A1 * | 12/2018 | Kim | ............... | H05K 5/0217 |
| 2019/0037716 A1 * | 1/2019 | Kim | ............... | H05K 5/0217 |
| 2019/0064578 A1 * | 2/2019 | Cho | ............... | G06F 1/1652 |
| 2019/0098774 A1 * | 3/2019 | Park | ............... | H05K 5/0017 |

(Continued)

FOREIGN PATENT DOCUMENTS

| | | |
|---|---|---|
| CN | 110874984 A | 3/2020 |
| EP | 3 107 082 A1 | 12/2016 |
| EP | 3 508 247 A1 | 7/2019 |

*Primary Examiner* — Sagar Shrestha

(74) *Attorney, Agent, or Firm* — Birch, Stewart, Kolasch & Birch, LLP

(57) ABSTRACT

A display device according to an exemplary embodiment of the present disclosure includes a display panel having a display area, a back cover disposed on a rear surface of the display panel, a first roller which winds or unwinds the back cover and the display panel, and a second roller which is disposed above the first roller to move in a vertical direction, the back cover and the display panel being overlaid on the second roller. The emission area is flexibly adjusted during the partial view so as to suppress a burn-in issue and improve the lifespan of the display device.

16 Claims, 24 Drawing Sheets

(56) References Cited

U.S. PATENT DOCUMENTS

| | | | | |
|---|---|---|---|---|
| 2019/0132987 A1* | 5/2019 | Koo | .................. | H05K 7/18 |
| 2019/0150300 A1* | 5/2019 | Kim | .................. | H05K 5/0217 |
| | | | | 361/807 |
| 2019/0197960 A1* | 6/2019 | Kim | .................. | G09G 3/035 |
| 2019/0198783 A1* | 6/2019 | Kim | .................. | H10K 59/12 |
| 2019/0246512 A1* | 8/2019 | Heo | .................. | G06F 1/1681 |
| 2019/0371214 A1* | 12/2019 | Kim | .................. | G09F 11/08 |
| 2020/0135064 A1* | 4/2020 | Lee | .................. | G06F 1/1652 |
| 2020/0320907 A1* | 10/2020 | Yamamoto | .................. | G06F 1/1652 |

\* cited by examiner

DISPLAY DEVICE

CROSS-REFERENCE TO RELATED APPLICATIONS

This application claims priority to Korean Patent Application No. 10-2020-0183010 filed on Dec. 24, 2020, in the Korean Intellectual Property Office, the entire contents of which are hereby expressly incorporated by reference into the present application.

BACKGROUND

Field

The present disclosure relates to a display device, and more particularly, to a rollable display device which is capable of displaying images even in a rolled state.

Description of the Related Art

As display devices which are used for a monitor of a computer, a television, a cellular phone, or the like, there are an organic light emitting display (OLED) apparatus which is a self-emitting apparatus, a liquid crystal display (LCD) apparatus which requires a separate light source, and the like.

An applicable range of the display device is diversified to personal digital assistants as well as monitors of computers and televisions and a display device with a large display area and a reduced volume and weight is being studied.

Recently, a rollable display device which is manufactured by forming a display element, a wiring line, and the like on a flexible substrate such as plastic which is a flexible material so as to be capable of displaying images even in the rolled state of the display device is getting attention as the next generation display device.

SUMMARY OF THE DISCLOSURE

An object to be achieved by the present disclosure is to provide a rollable display device which is capable of providing a partial view without causing a burn-in.

Objects of the present disclosure are not limited to the above-mentioned objects, and other objects, which are not mentioned above, can be clearly understood by those skilled in the art from the following descriptions.

In order to achieve the above-described object, according to an aspect of the present disclosure, a display device includes a display panel having a display area, a back cover disposed on a rear surface of the display panel, a first roller which winds or unwinds the back cover and the display panel, and a second roller which is disposed above the first roller to move in a vertical direction, the back cover and the display panel being overlaid thereon.

According to another aspect of the present disclosure, a display device includes a display panel having a display area, a back cover disposed on a rear surface of the display panel, a first roller which is connected to a lower end of the back cover to wind or unwind the back cover and the display panel, and a second roller which is disposed above the first roller to move in a vertical direction and is fastened with an upper end of the back cover.

According to still another aspect of the present disclosure, a display device includes a display panel having a display area, a back cover disposed on a rear surface of the display panel, a first roller which is disposed in a housing unit and winds or unwinds the back cover and the display panel, a second roller which is disposed above the first roller to move in a vertical direction, the back cover and the display panel being overlaid, a third roller disposed in the housing unit, and an extending sheet which is disposed at an upper end of the back cover or the rear surface of the back cover and is fastened with the third roller through an upper end.

Other detailed matters of the exemplary embodiments are included in the detailed description and the drawings.

According to the present disclosure, a plurality of rollers is applied to flexibly adjust an emission area during the partial view. Therefore, the burn-in phenomenon is suppressed or minimized so as to improve the lifespan of the display device.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1A:
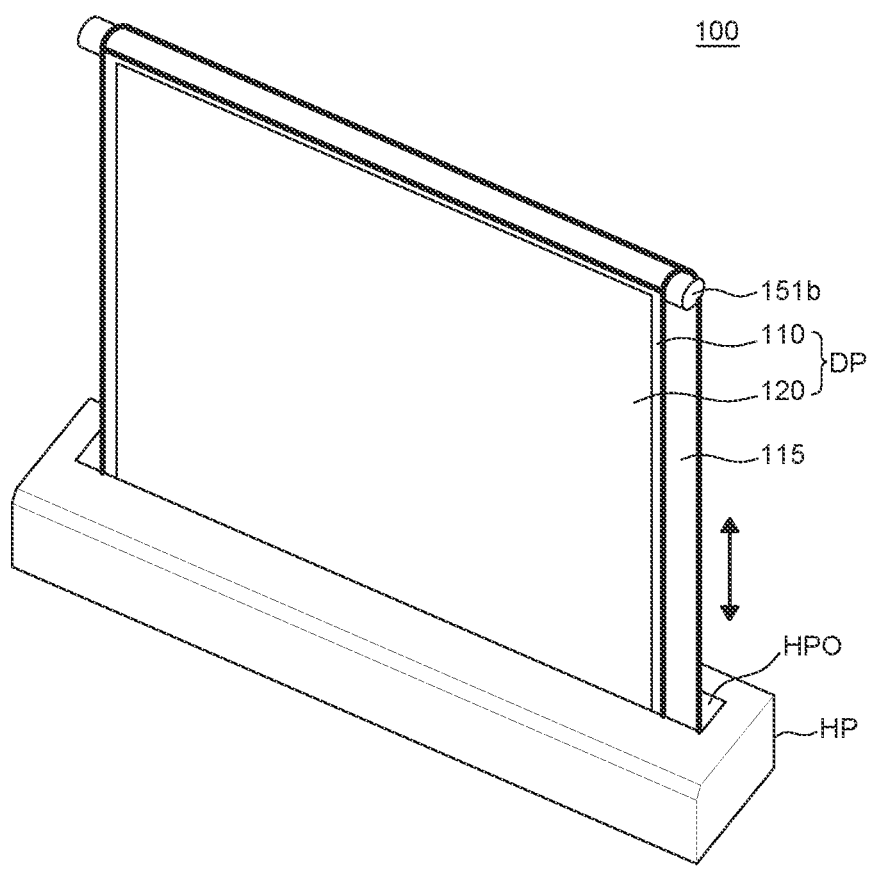
FIGS. 1A and 1B are perspective views of a display device according to a first exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components and may not define order. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, exemplary embodiments of the present disclosure will be described in detail with reference to accompanying drawings.

<Display Device—a Rollable Display Device>

A rollable display device can also be referred to as a display device which is capable of displaying images even though the display device is rolled. The rollable display device can have a high flexibility as compared with a general display device of the related art. Depending on whether to use a rollable display device, a shape of the rollable display device can freely vary. Specifically, when the rollable display device is not used, the rollable display device is rolled to be stored with a reduced volume. In contrast, when the rollable display device is used, the rolled rollable display device is unrolled to be used.

Figure 1B:
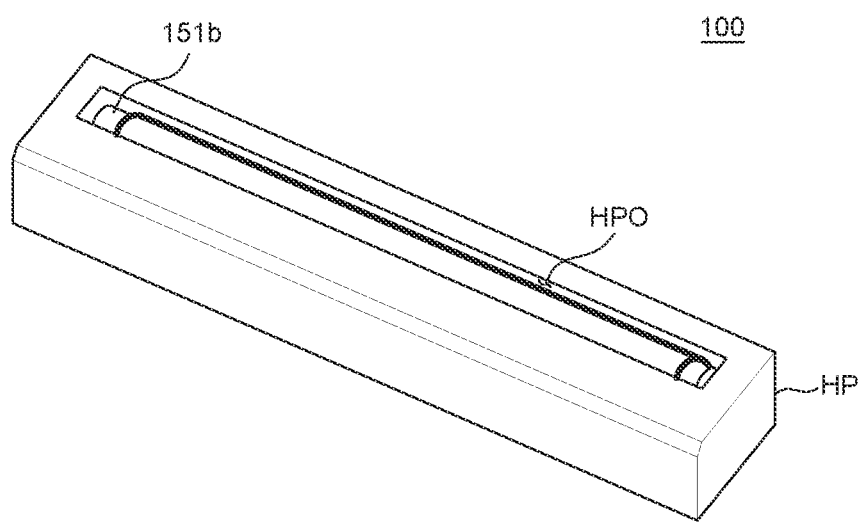

FIGS. 1A and 1B are perspective views of a display device according to a first exemplary embodiment of the present disclosure. All the components of each display device according to all embodiments of the present disclosure are operatively coupled and configured.

Referring to FIGS. 1A and 1B, a display device 100 according to the first exemplary embodiment of the present disclosure can include a display unit DP and a housing unit HP.

The display unit DP is a configuration for displaying images to a user and for example, in the display unit DP, a display element and a circuit, a wiring line, a component, and the like for driving the display element can be disposed.

Since the display device 100 according to the first exemplary embodiment of the present disclosure is a rollable display device 100, the display unit DP can be configured to be wound and unwound. For example, the display unit DP according to the first exemplary embodiment of the present disclosure can be formed of a display panel 120 and a back cover 110 each having a flexibility to be wound or unwound. The display unit DP will be described below in more detail with reference to FIGS. 6 and 7.

In the meantime, the display device 100 according to the first exemplary embodiment of the present disclosure can perform a partial view that only a partial area of the display panel 120 emits light to be utilized as a display area.

To this end, the display device 100 according to the first exemplary embodiment of the present disclosure includes a second roller 151b and a third roller in addition to a main roller, for example, a first roller. However, it is not limited thereto and the display device may not include the third roller.

Further, the extending sheet 115 extending from the display unit DP can be provided on a rear surface of the display unit DP to be fastened with the third roller.

The housing unit HP is a case in which the display unit DP is accommodated. Specifically, the display unit DP, the extending sheet 115, and the second roller 151b can be accommodated in the housing unit HP. The housing unit HP can have an opening HPO through which the display unit DP, the extending sheet 115, and the second roller 151b move to the inside and the outside of the housing unit HP. The display unit DP, the extending sheet 115, and the second roller 151b can move in a vertical direction through the opening HPO of the housing unit HP. At this time, according to the first exemplary embodiment of the present disclosure, one opening HPO is provided, but is not limited thereto so that two openings are provided to move the display unit DP and the extending sheet 115 in the vertical direction, respectively.

The display unit DP of the display device 100 can be switched from a fully unwound state to a fully wound state or from a fully wound state to a fully unwound state.

FIG. 1A illustrates the display unit DP of the display device 100 which is fully unwound as an example and in the fully unwound state, the display unit DP of the display device 100 is disposed at the outside of the housing unit HP. For example, in order for a user to watch images through the display device 100, when the display unit DP is unwound to be disposed at the outside of the housing unit HP as much as possible and cannot be further unwound, it can be defined as a fully unwound state.

FIG. 1B illustrates the display unit DP of the display device 100 which is fully wound as an example and in the fully wound state, the display unit DP of the display device 100 is accommodated in the housing unit HP and cannot be further wound. For example, when the user does not watch the images through the display device 100, it is advantageous from the viewpoint of an outer appearance that the display unit DP, the extending sheet 115, and the second roller 151b are not disposed at the outside of the housing unit HP. Therefore, when the display unit DP, the extending sheet 115, and the second roller 151b are accommodated in the housing unit HP, it is defined as a fully wound state. However, it is not limited thereto, so that when two openings are provided, the second roller 151b can be disposed at the outside of the housing unit HP.

In order to switch the display unit DP to a fully unwound state or a fully wound state, a driving unit which winds or unwinds the display unit DP can be disposed.

<Driving Unit>

Figure 2A:
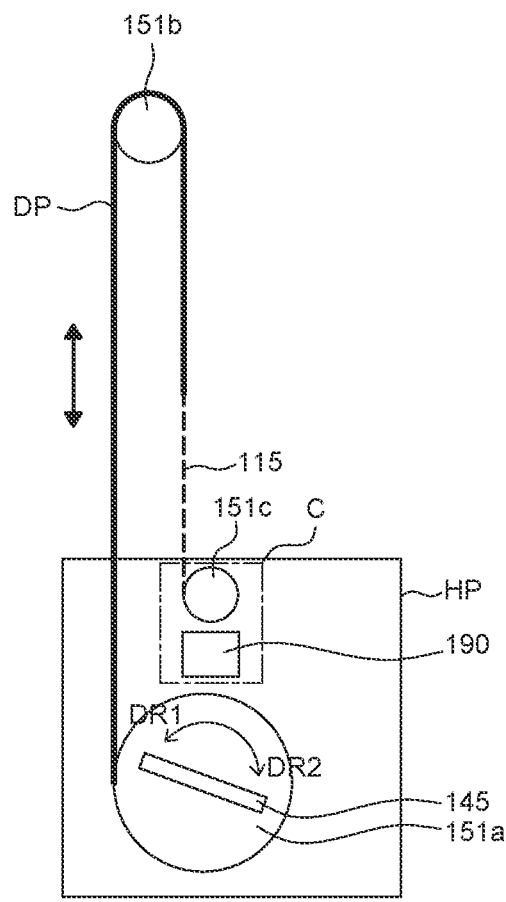
FIGS. 2A and 2B are schematic cross-sectional views of a display device according to the first exemplary embodiment of the present disclosure.
Figure 2B:
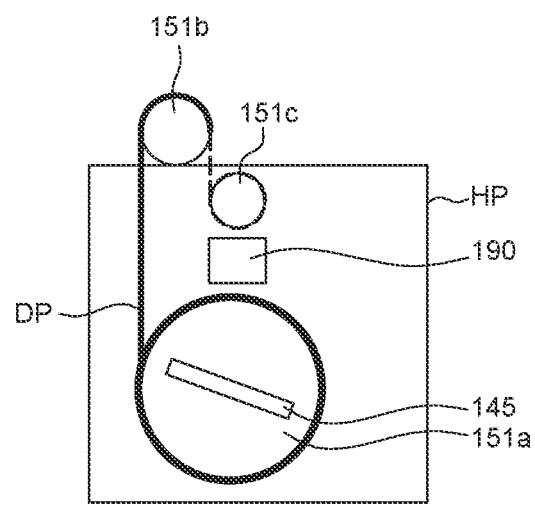

FIGS. 2A and 2B are schematic cross-sectional views of a display device according to a first exemplary embodiment of the present disclosure.

Figure 3:
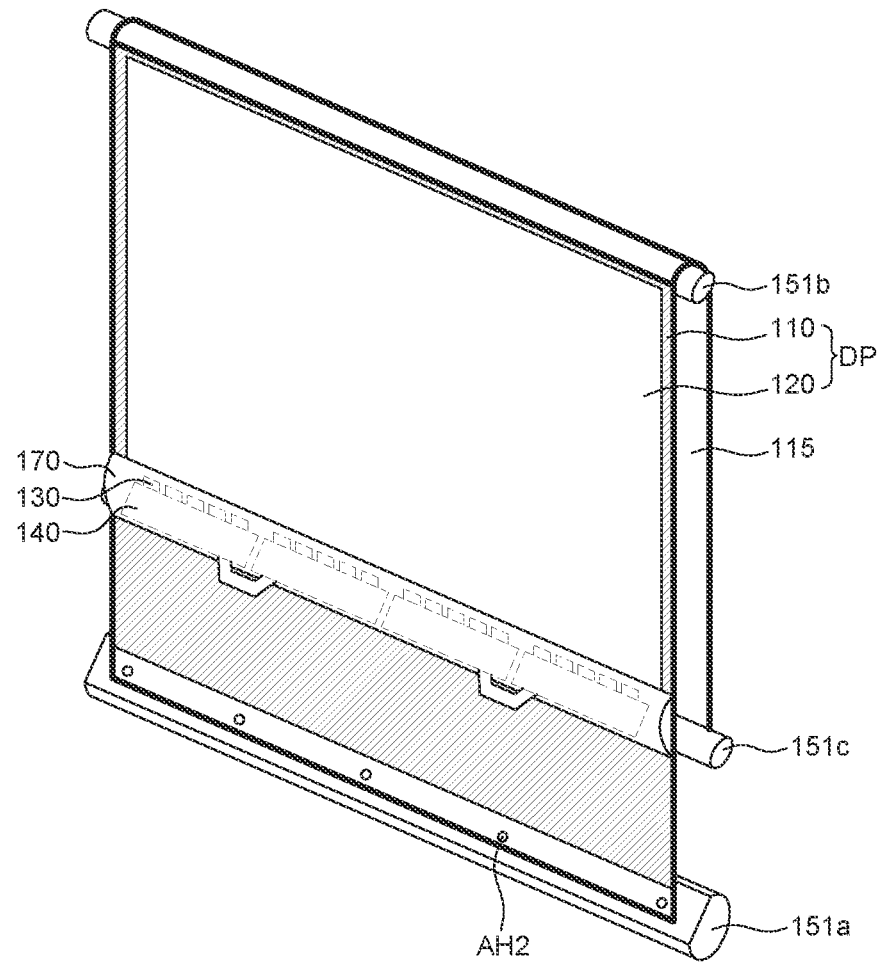
FIG. 3 is a perspective view of a display device according to the first exemplary embodiment of the present disclosure.

FIG. 3 is a perspective view of the display device according to the first exemplary embodiment of the present disclosure.

Figure 4:
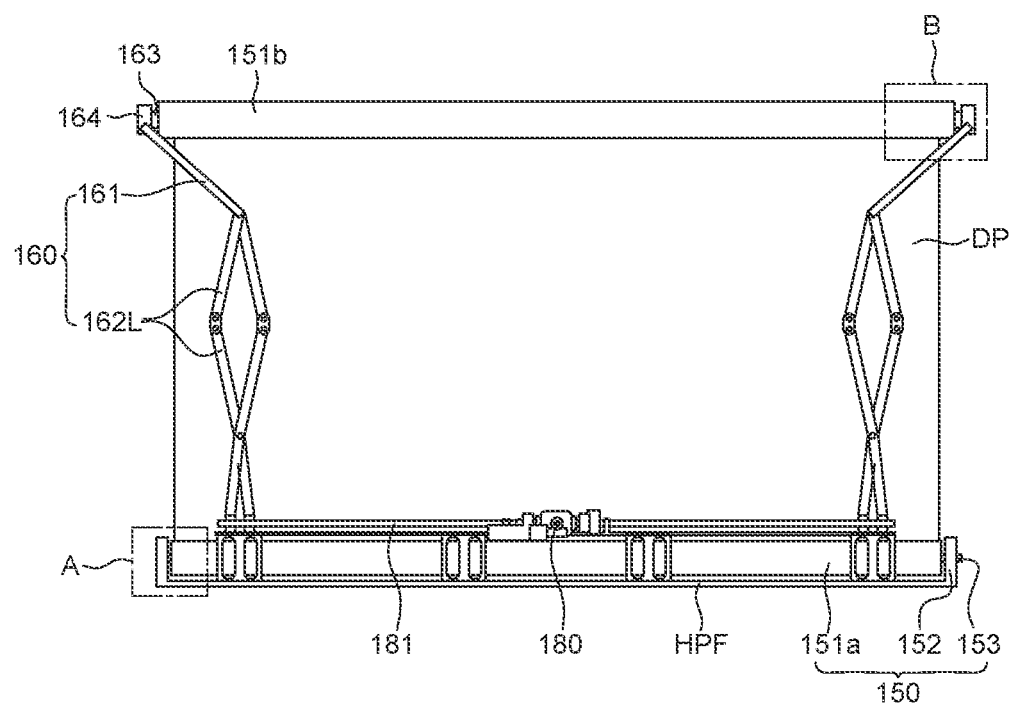
FIG. 4 is a rear view of a display device according to the first exemplary embodiment of the present disclosure.

FIG. 4 is a rear view of the display device according to the first exemplary embodiment of the present disclosure.

Figure 5A:
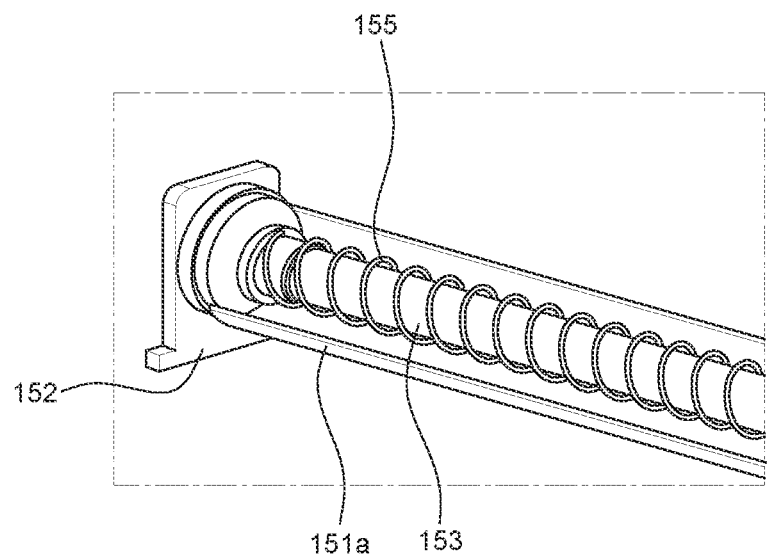
FIG. 5A is an enlarged view of an area A of FIG. 4.

FIG. 5A is an enlarged view of an area A of FIG. 4.

Figure 5B:
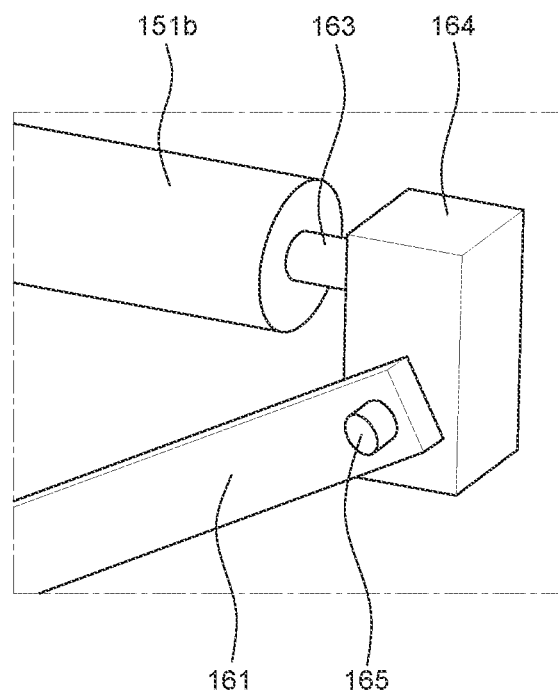
FIG. 5B is an enlarged view of an area B of FIG. 4.

FIG. 5B is an enlarged view of an area B of FIG. 4.

Figure 5C:
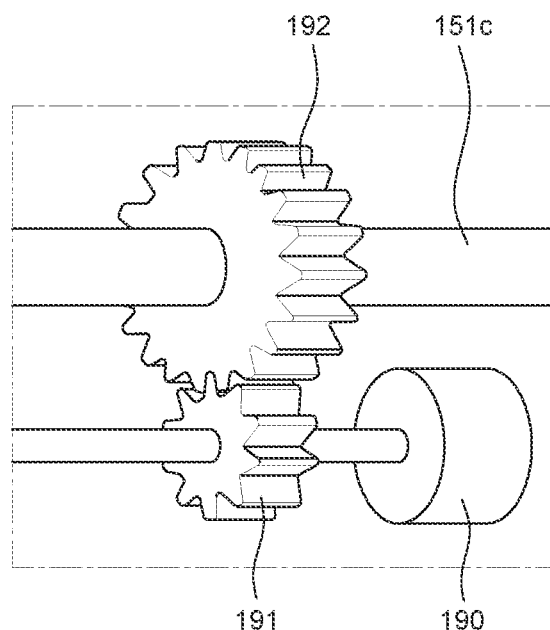
FIG. 5C is an enlarged view of an area C of FIG. 2A.

FIG. 5C is an enlarged view of an area C of FIG. 2A.

FIGS. 2A and 2B are schematic cross-sectional views for explaining a first roller 151a, a second roller 151b, and a third roller 151c in the display device 100 according to the first exemplary embodiment of the present disclosure. However, the present disclosure is not limited to the structure illustrated in FIGS. 2A and 2B.

For the convenience of description, in FIG. 3, a configuration of the driving unit is omitted and in FIG. 4, the extending sheet 115 and the third roller 151c are omitted to show the configuration of the driving unit.

Referring to FIGS. 2A to 4, the display unit DP can include a back cover 110, a display panel 120, a flexible film 130, and a printed circuit board 140.

Further, the display unit DP can further include a cover unit 170 which covers and protects the printed circuit board 140.

Further, the driving unit for driving the display unit DP can be configured to include a roller unit 150 and a lifting unit 160.

The roller unit 150 can include a first roller 151a, a roller support unit 152, and a first rotary shaft 153.

The roller unit 150 can rotate the first roller 151a in a first direction DR1 or a second direction DR2 and can wind or unwind the display unit DP fixed to the roller unit 150.

The roller unit 150 can be provided in the housing unit HP.

The first roller 151a can include a source printed circuit board 145 therein, but is not limited thereto.

The first roller 151a is a member around which the display unit DP is wound. The first roller 151a can be, for example, formed to have a cylindrical shape. Specifically, referring to FIG. 3, the first roller 151a of the present disclosure has a D-cut shape in which a part of a cylindrical shape has a flat shape, but is not limited thereto.

A lower edge of the display unit DP can be fixed to the first roller 151a. For example, a screw passes through the second fastening hole AH2 so that the lower edge of the back cover 110 can be fastened with the first roller 151a, but is not limited thereto.

When the first roller 151a rotates in a first direction DR1, for example, a counterclockwise direction, the display unit DP fixed to the first roller 151a through the lower edge can be wound around the first roller 151a. In contrast, when the first roller 151a rotates in a second direction DR2 which is an opposite direction, for example, a clockwise direction, the display unit DP wound around the first roller 151a can be unwound from the first roller 151a. The first roller 151a can be formed of a metal material or a plastic material having a rigidity.

The driving unit according to the first exemplary embodiment of the present disclosure can further include a second roller 151b and a third roller 151c.

When only one first roller 151a is provided in the housing unit HP, if a partial view function is utilized, a specific part of the display panel 120, for example, only an end of the display panel 120 can be used for the partial view. In this case, the partial view area emits relatively lighter, as compared with the remaining part of the display panel 120, so that a burn-in issue can be caused.

Therefore, in the first exemplary embodiment of the present disclosure, in addition to the first roller 151a, the second roller 151b is provided at the outside of the housing unit HP, and the third roller 151c is provided in the housing unit HP. For example, according to the first exemplary embodiment of the present disclosure, in order to drive the display unit DP, three rollers including the first roller 151a, the second roller 151b, and the third roller 151c, two motors including a first motor 180 and a second motor 190, and one torsion spring 155 can be provided.

The position of the emission area of the display panel 120 can be flexibly adjusted by the vertical movement of the second roller 151b and the rolling of the third roller 151c so that the partial view is possible without causing the burn-in issue.

The display unit DP and/or the extending sheet 115 are overlaid on the second roller 151b and an end of the extending sheet 115 can be fastened with the third roller 151c.

The third roller 151c is connected to the second motor 190 to be rotatably driven, but is not limited thereto. For the simplification of the driving or the equipment, the third roller 151c can use a spring instead of the second motor 190.

As described above, the position of the emission area of the display panel 120 can be adjusted in accordance with a rotation state of the first roller 151a, a lifted height of the second roller 151b, and a rotation state of the third roller 151c.

Specifically, referring to FIG. 5A together, the roller support unit 152 can support the first roller 151a on both sides of the first roller 151a.

Specifically, the roller support unit 152 can be disposed on a bottom surface HPF of the housing unit HP. Upper side surfaces of the roller support unit 152 can be coupled to both ends of the first roller 151a. Therefore, the roller support unit 152 allows the first roller 151a to be rotatably coupled to the roller support unit 152 to be spaced apart from the bottom surface HPF of the housing unit HP. Therefore, the first roller 151a can rotate around the first rotary shaft 153 in the first direction DR1 or the second direction DR2. The rolling of the first roller 151a can be performed by a torsion spring 155 installed in the first roller 151a.

The torsion spring 155 is wound around the first rotary shaft 153 to be installed in the first roller 151a, but is not limited thereto. The torsion spring 155 pulls the display unit DP downwardly at all times and upwardly pushes the display unit DP by the driving of the first motor 180.

For example, the driving unit can further include a first motor 180 and a driving shaft 181.

The first motor 180 can include a gear box, but is not limited thereto.

The driving force of the first motor 180 can be transmitted to the lifting unit 160 by means of the driving shaft 181. A plurality of links 162L of the lifting unit 160 is upwardly unfolded by the driving of the first motor 180 to push up the second roller 151b fastened with the roller lifting unit 161 and thus, the display unit DP can be upwardly driven.

For example, the lifting unit 160 moves the display unit DP in a vertical direction in accordance with the driving of the roller unit 150. The lifting unit 160 can include a plurality of links 162L which is hinged to each other and a roller lifting unit 161 fixed to an end of the link 162L. Each of the plurality of links 162L is rotatably hinged to each other to be lifted and lowered in the vertical direction by the driving of the first motor 180. When the plurality of links 162L moves in the vertical direction, each of the plurality of links 162L can rotate to be farther from each other or closer to each other.

Referring to FIG. 5B together, one end of the roller lifting unit 161 is fixedly coupled to one end of the link 162L and the other end can be rotatably fastened with the fastening unit 164 connected to a second rotary shaft 163. The roller lifting unit 161 and the link 162L can form a predetermined angle so that the link 162L is not seen from the front surface of the display device 100, but is not limited thereto. A length of the roller lifting unit 161 can be set to accommodate the roller lifting unit 161 in the housing unit HP.

The second roller 151b is axially coupled to the second rotary shaft 163 and the second rotary shaft 163 can be rotatably fastened with the fastening unit 164. The roller lifting unit 161 can be rotatably fastened with the fastening unit 164 by means of a hinge rotation bush 165, but is not limited thereto. Therefore, the roller lifting unit 161 is lifted or lowered to lift or lower the second roller 151b fastened with the fastening unit 164. By doing this, the display unit DP can be lifted or lowered.

In the meantime, referring to FIG. 5C together, the third roller 151c can rotate by the driving of the second motor 190. The third roller 151c can be connected to the second motor 190 by means of gears 191 and 192 to rotate. The extending sheet 115 can be wound around or unwound from the third roller 151c by the rotation of the third roller 151c and thus the emission area of the display unit DP can be adjusted.

In some exemplary embodiments, a driving unit having a structure other than the above-described driving unit can be applied to the display device 100. For example, as long as the display unit DP is wound and unwound, the above-described configuration of the roller unit 150 and the lifting unit 160 can be modified, some configurations can be omitted, or another configuration can be added.

Hereinafter, the display unit DP and the extending sheet 115 can be described in more detail with reference to FIGS. 6 and 7 together.

<Display Unit>

Figure 6:
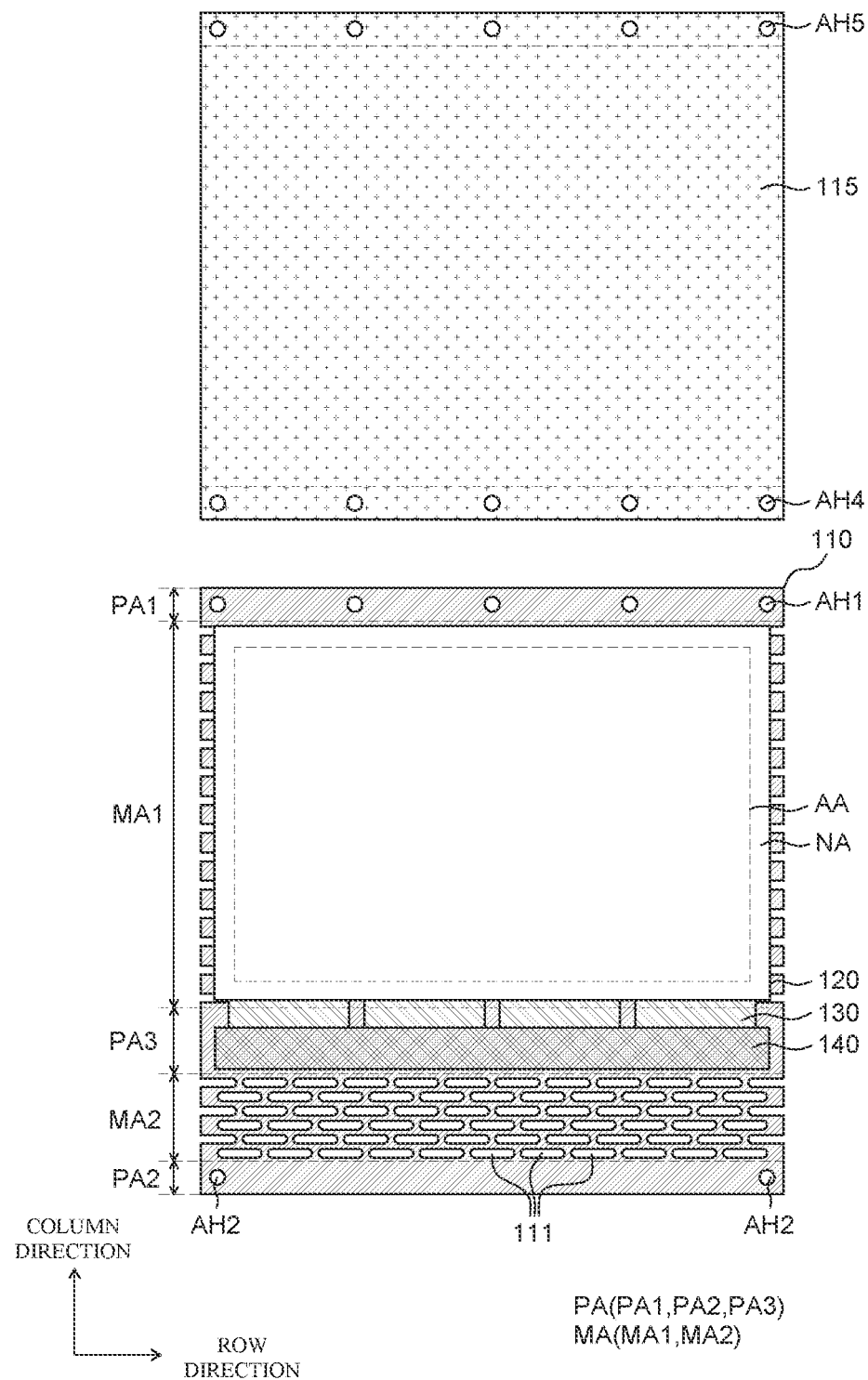
FIG. 6 is a plan view illustrating an example of a display unit and an extending sheet of a display device according to the first exemplary embodiment of the present disclosure.

FIG. 6 is a plan view illustrating an example of a display unit and an extending sheet of a display device according to the first exemplary embodiment of the present disclosure.

Figure 7:
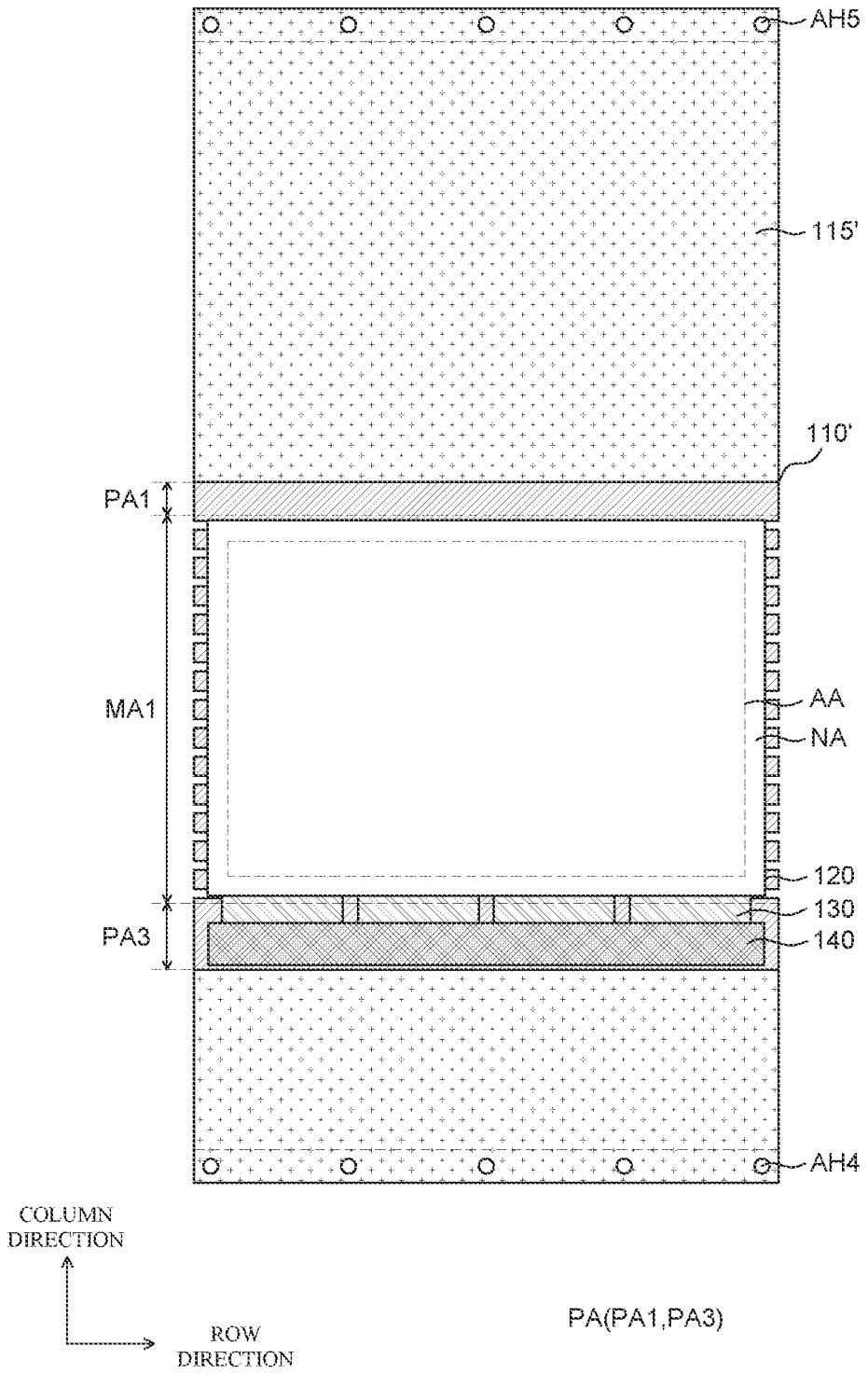
FIG. 7 is a plan view illustrating another example of a display unit and an extending sheet of a display device according to the first exemplary embodiment of the present disclosure.

FIG. 7 is a plan view illustrating another example of a display unit and an extending sheet of a display device according to the first exemplary embodiment of the present disclosure.

Referring to FIG. 6 or 7, the display unit DP can include a back cover 110, 110', a display panel 120, a flexible film 130, and a printed circuit board 140.

The display panel 120 is a panel for displaying images to a user.

The display panel 120 can include a display element which displays images, a driving element which drives the display element, wiring lines which transmit various signals to the display element and the driving element, and the like. The display element can be defined in different ways depending on a type of the display panel 120. For example, when the display panel 120 is an organic light emitting display panel, the display element can be an organic light emitting diode which includes an anode, an organic light emitting layer, and a cathode. For example, when the display panel 120 is a liquid crystal display panel, the display element can be a liquid crystal display element. Hereinafter, even though the display panel 120 is assumed as an organic light emitting display panel, the display panel 120 is not limited to the organic light emitting display panel.

Further, since the display device 100 according to the first exemplary embodiment of the present disclosure is a rollable display device, the display panel 120 can be implemented as a flexible display panel to be wound around or unwound from the first roller 151a.

The display panel 120 can include a display area AA and a non-display area NA.

The display area AA is an area where images are displayed in the display panel 120.

In the display area AA, a plurality of sub pixels which configures the plurality of pixels and a circuit for driving the plurality of sub pixels can be disposed. The plurality of sub pixels is minimum units which configure the display area AA and a display element can be disposed in each of the plurality of sub pixels. The plurality of sub pixels can configure a pixel. For example, an organic light emitting diode which includes an anode, an organic light emitting layer, and a cathode can be disposed in each of the plurality of sub pixels, but it is not limited thereto. Further, a circuit for driving the plurality of sub pixels can include a driving element, a wiring line, and the like. For example, the circuit can be configured by a thin film transistor, a storage capacitor, a gate line, a data line, and the like, but is not limited thereto.

The non-display area NA is an area where no image is displayed.

In the non-display area NA, various wiring lines and circuits for driving the organic light emitting diode of the display area AA are disposed. For example, in the non-display area NA, a link line which transmits signals to the plurality of sub pixels and circuits of the display area AA, a driving IC such as a gate driver IC or a data driver IC, or the like can be disposed, but it is not limited thereto.

The flexible film 130 is a film in which various components are disposed on a base film having a malleability. Specifically, the flexible film 130 is a film which supplies a signal to the plurality of sub pixels and the circuits of the display area AA and is electrically connected to the display panel 120. The flexible film 130 is disposed at one end of the non-display area NA of the display panel 120 to supply a power voltage, a data voltage, or the like to the plurality of sub pixels and the circuits of the display area AA. Even though four flexible films 130 are illustrated in FIGS. 6 and 7, the number of flexible films 130 can vary depending on the design and is not limited thereto.

In the meantime, for example, a driving IC such as a gate driver IC or a data driver IC can be disposed on the flexible film 130. The driving IC is a component which processes data for displaying images and a driving signal for processing the data. The driving IC can be disposed by a chip on glass (COG), a chip on film (COF), a tape carrier package (TCP), or the like depending on a mounting method. However, for the convenience of description, it is described that the driving IC is mounted on the flexible film 130 by a chip on film manner, but is not limited thereto.

The printed circuit board 140 is disposed at one end of the flexible film 130 to be connected to the flexible film 130. The printed circuit board 140 is a component which supplies signals to the driving IC. The printed circuit board 140 can supply various signals such as a driving signal or a data signal to the driving IC. For example, a data driver which generates data signals can be mounted in the printed circuit board 140 and the generated data signal can be supplied to the plurality of sub pixels and the circuit of the display panel 120 through the flexible film 130. Even though one printed circuit board 140 is illustrated in FIGS. 6 and 7, the number of printed circuit boards 140 can vary depending on the design and is not limited thereto.

The back cover 110, 110' is disposed on rear surfaces of the display panel 120, the flexible film 130, and the printed circuit board 140 to support the display panel 120, the flexible film 130, and the printed circuit board 140. Therefore, a size of the back cover 110, 110' can be larger than a size of the display panel 120. Therefore, the back cover 110, 110' can protect other configurations of the display unit DP from the outside. Even though the back cover 110, 110' is formed of a material having a rigidity, at least a part of the back cover 110, 110' can have a flexibility to be wound or unwound together with the display panel 120. For example, the back cover 110, 110' can be formed of a metal material such as steel use stainless SUS or invar, plastic, or the like. However, as long as a material of the back cover 110, 110' satisfies physical conditions such as a thermal strain, a radius of curvature, and a rigidity, various materials can be used, and is not limited thereto.

In the meantime, the back cover 110, 110' can include a plurality of openings 111.

The plurality of openings 111 can allow the back cover 110, 110' to have a flexibility. The plurality of openings 111 can be flexibly deformed and allow the back cover 110, 110' to be wound around the first roller 151a or unwound from the first roller 151a together with the display panel 120.

The back cover 110, 110' can include a plurality of support areas PA and a plurality of malleable areas MA. The plurality of support areas PA is areas where a plurality of openings 111 is not disposed and the plurality of malleable areas MA is areas where a plurality of openings 111 is disposed. For example, referring to FIG. 6, in the back cover 110, a first support area PA1, a first malleable area MA1, a third support area PA3, a second malleable area MA2, and a second support area PA2 are sequentially disposed from the uppermost end of the back cover 110. However, the present disclosure is not limited thereto and referring to FIG. 7, in the back cover 110', the first support area PA1, the first malleable area MA1, and the third support area PA3 can be sequentially disposed from the uppermost end of the back cover 110'. Hereinafter, the back cover 110 of FIG. 6 will be mainly described, but the same configuration can be applied to the back cover 110' of FIG. 7 in the same manner.

The first support area PA1 of the back cover 110 is an uppermost area of the back cover 110 and is fastened with the extending sheet 115. A first fastening hole AH1 can be formed in the first support area PA1 to be fastened with the extending sheet 115 and a fourth fastening hole AH4 can be formed in the corresponding extending sheet 115. For example, the display unit DP and the extending sheet 115 can be fastened with each other by means of a fixing member which passes through the first fastening hole AH1 and the fourth fastening hole AH4. However, it is not limited thereto and as illustrated in FIG. 7, the display unit DP and the extending sheet 115 can be fastened by means of the other configuration, such as an adhesive layer or an adhesive tape.

Further, the first malleable area MA1 is an area extending from the first support area PA1 to a lower side of the back cover 110. The first malleable area MA1 is an area in which a plurality of openings 111 is disposed and the display panel 120 is attached.

The third support area PA3 is an area extending from the first malleable area MA1 to the lower side of the back cover 110. A flexible film 130 which is connected to one end of the display panel 120 and a printed circuit board 140 can be disposed in the third support area PA3.

In order to protect the flexible film 130 and the printed circuit board 140, the third support area PA3 can support the flexible film 130 and the printed circuit board 140 to be wound around the first roller 151a in a flat shape, rather than a curved shape. A part of the first roller 151a can be formed to be flat, corresponding to the third support area PA3, but is not limited thereto.

The second malleable area MA2 is an area extending from the third support area PA3 to a lower side of the back cover 110. A plurality of openings 111 can be disposed in the second malleable area MA2.

The second malleable area MA2 extends to dispose the display area AA of the display panel 120 at the outside of the housing unit HP. For example, when the back cover 110 and the display panel 120 are fully unwound, the second support area PA2 of the back cover 110 which is fixed to the first roller 151a to the third support area PA3 can be disposed in the housing unit HP. The first malleable area MA1 and the first support area PA1 to which the display panel 120 is attached can be disposed at the outside of the housing unit HP.

The second support area PA2 of the back cover 110 is a lowermost area of the back cover 110 and can be fastened with the first roller 151a. The second support area PA2 can include second fastening holes AH2 to be fastened with the first roller 151a. For example, the first roller 151a and the second support area PA2 of the back cover 110 can be fastened with each other by a screw which passes through the first roller 151a and the second fastening holes AH2. As the second support area PA2 is fastened with the first roller 151a, the back cover 110 can be wound around or unwound from the first roller 151a by the rotation of the first roller 151a. However, the present disclosure is not limited thereto, and referring to FIG. 7, the fourth fastening hole AH4 can be formed at a lower end of the extending sheet 115' to be fastened with the first roller 151a. For example, the first roller 151a and the extending sheet 115' can be fastened with each other by a screw which passes through the first roller 151a and the fourth fastening hole AH4.

In the meantime, the extending sheet 115, 115' of the present disclosure can be disposed above the display unit DP or on a rear surface of the back cover 110.

Referring to FIG. 6, the extending sheet 115 can be connected to an upper end of the display unit DP.

For example, as described above, at least one fourth fastening hole AH4 can be disposed at a lower end of the extending sheet 115. The back cover 110 and the extending sheet 115 can be fastened with each other by a screw which passes through the first fastening hole AH1 and the fourth fastening hole AH4.

At least one fifth fastening hole AH5 can be formed at an upper end of the extending sheet 115. For example, the third roller 151c and the extending sheet 115 can be fastened with each other by a screw which passes through the third roller 151c and the fifth fastening hole AH5.

The extending sheet 115 can be configured by a plastic material such as polyethylene terephthalate (PET), but is not limited thereto.

In contrast, referring to FIG. 7, the back cover 110' can be attached onto the extending sheet 115'. In this case, the back cover 110' may not include the second malleable area and the second support area and in the first support area PA1 of the back cover 110', the first fastening hole may not be provided, but is not limited thereto.

The extending sheet 115' covers the display unit DP and can extend to the upper portion and the lower portion.

At least one fifth fastening hole AH5 can be formed at an upper end of the extending sheet 115'. For example, the third roller 151c and the extending sheet 115' can be fastened with each other by a screw which passes through the third roller 151c and the fifth fastening hole AH5.

The extending sheet 115' can be configured by a plastic material such as polyethylene terephthalate PET, but is not limited thereto.

Hereinafter, a display method of the display device configured as described above such as a full view or a partial view can be described in more detail.

<Display Method>

Figure 8A:
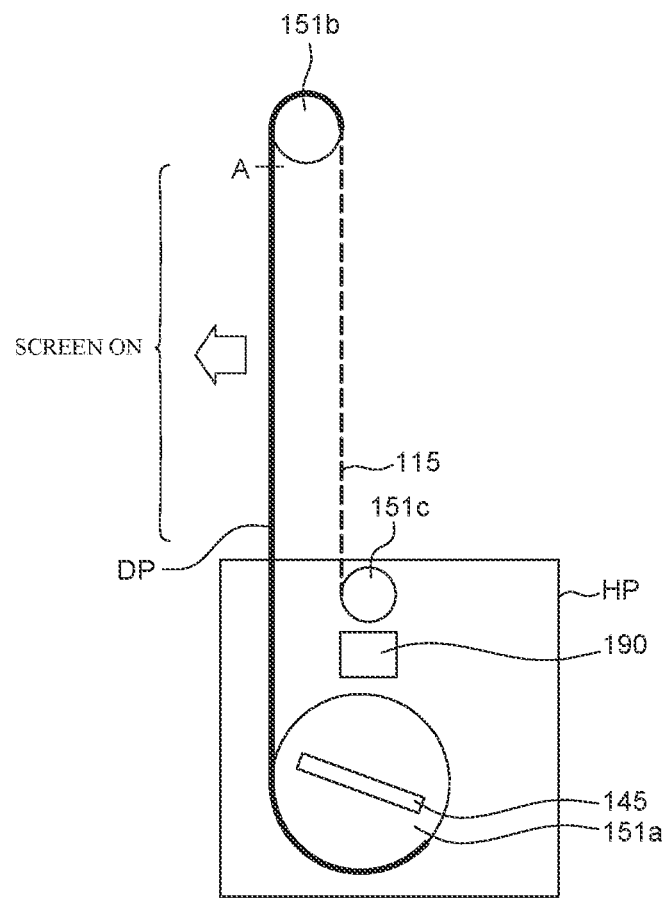
FIGS. 8A and 8B are cross-sectional views illustrating an example of a partial view in a display device according to the first exemplary embodiment of the present disclosure.
Figure 8B:
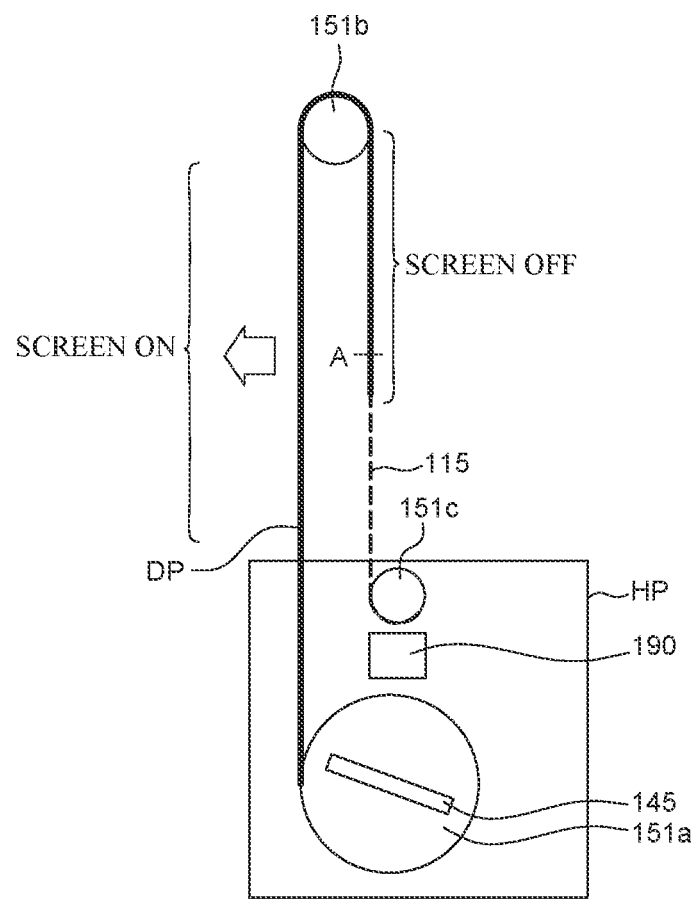

FIGS. 8A and 8B are cross-sectional views illustrating an example of a partial view in a display device according to the first exemplary embodiment of the present disclosure.

The reference symbol "A" illustrated in FIGS. 8A and 8B denotes an upper end of the display area of the display panel. In a screen ON illustrated in FIGS. 8A and 8B, a signal is applied to the display panel to display images and in a screen OFF, a signal is not applied to the corresponding display panel so that the image is not displayed.

FIG. 8A illustrates a basic type of a partial view as an example and FIG. 8B illustrates a modified shape of a partial view in which a watching area moves. Here, the watching area refers to a display area of the screen ON.

Referring to FIG. 8A, in the display device according to the first exemplary embodiment of the present disclosure, the first motor can lift the display unit DP and the second motor 190 can roll the extending sheet 115.

The first motor and the second motor 190 are controlled to lift and lower the display unit DP and change the watching area.

The first motor is driven to lift the lifting unit and the second motor 190 is driven to wind the extending sheets 115 around the third roller 151c to lift and lower the display unit DP.

At this time, when the first motor is turned off, a total height of the watching area is constantly maintained and the corresponding display area is driven (ON) to watch the image.

In the meantime, referring to FIG. 8B, when the second motor 190 is driven in this state, the watching area can be changed. For example, the second motor 190 is driven to roll the third roller 151c, so that the extending sheet 115 is wound around or unwound from the third roller 151c and thus the watching area can be moved and the emission area can be flexibly adjusted. Therefore, the burn-in phenomenon is suppressed to improve the lifespan.

In the meantime, according to the present disclosure, the image can be watched not only on the front surface of the display device, but also on the rear surface of the display device, which will be described in more detail with reference to the drawing.

Figure 9:
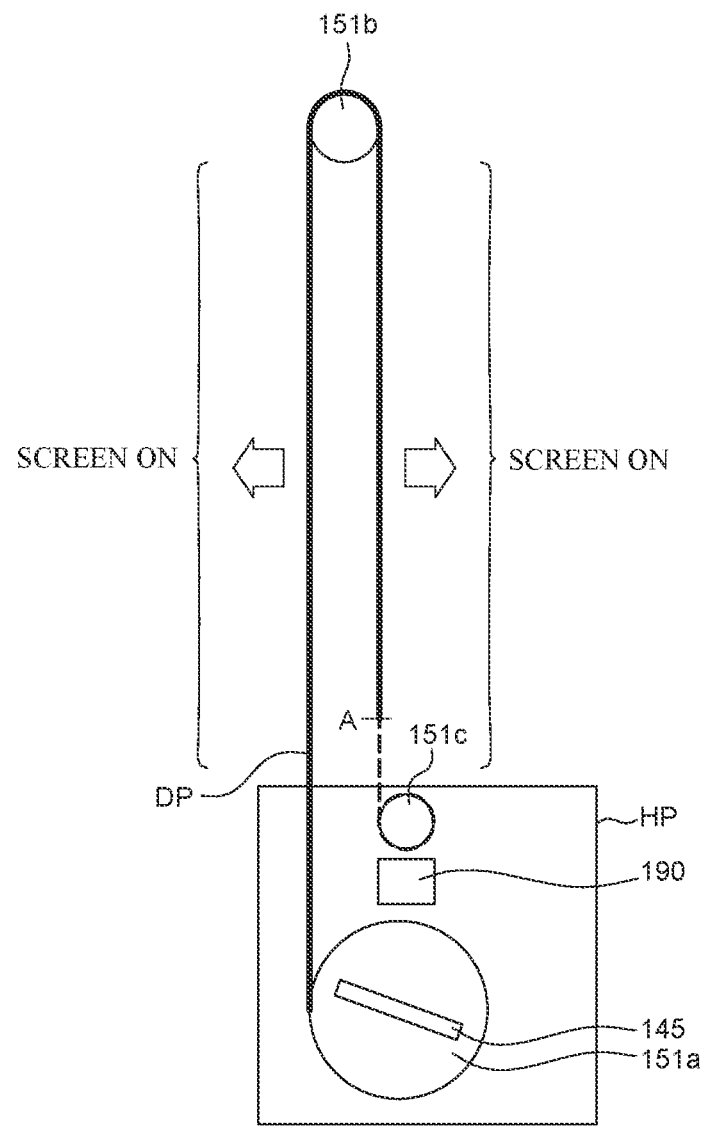
FIG. 9 is a cross-sectional view illustrating an example of a double-sided view in a display device according to the first exemplary embodiment of the present disclosure.

FIG. 9 is a cross-sectional view illustrating a double-sided view in a display device according to the first exemplary embodiment of the present disclosure, as an example.

A difference between a display device of FIG. 9 and the display device of FIGS. 8A and 8B is the driving of the display area, and other configurations are substantially the same so that a redundant description will be omitted or may be briefly provided. The same configuration will be denoted with the same reference numeral.

A referential symbol A illustrated in FIG. 9 denotes an upper end of the display area of the display panel. Further, the screen ON illustrated in FIG. 9 indicates that a signal is applied to a corresponding display panel to display images.

Referring to FIG. 9, the first motor is driven to lift the lifting unit and the second motor 190 is driven to wind the extending sheets 115 around the third roller 151c to lift and lower the display unit DP.

In this case, the extending sheet 115 is sufficiently wound around the third roller 151c so that the upper end A of the display area can be located to be close to the third roller 151c.

When the first motor is turned off, a total height of the watching area is constantly maintained and the corresponding display area is driven (ON) to watch the image. Therefore, the display area is located not only on the front surface of the display device, but also on the rear surface so that both display areas are driven (ON) to simultaneously watch the images on both sides.

At this time, a total height of the watching area can be adjusted by driving the first motor.

Figure 10A:
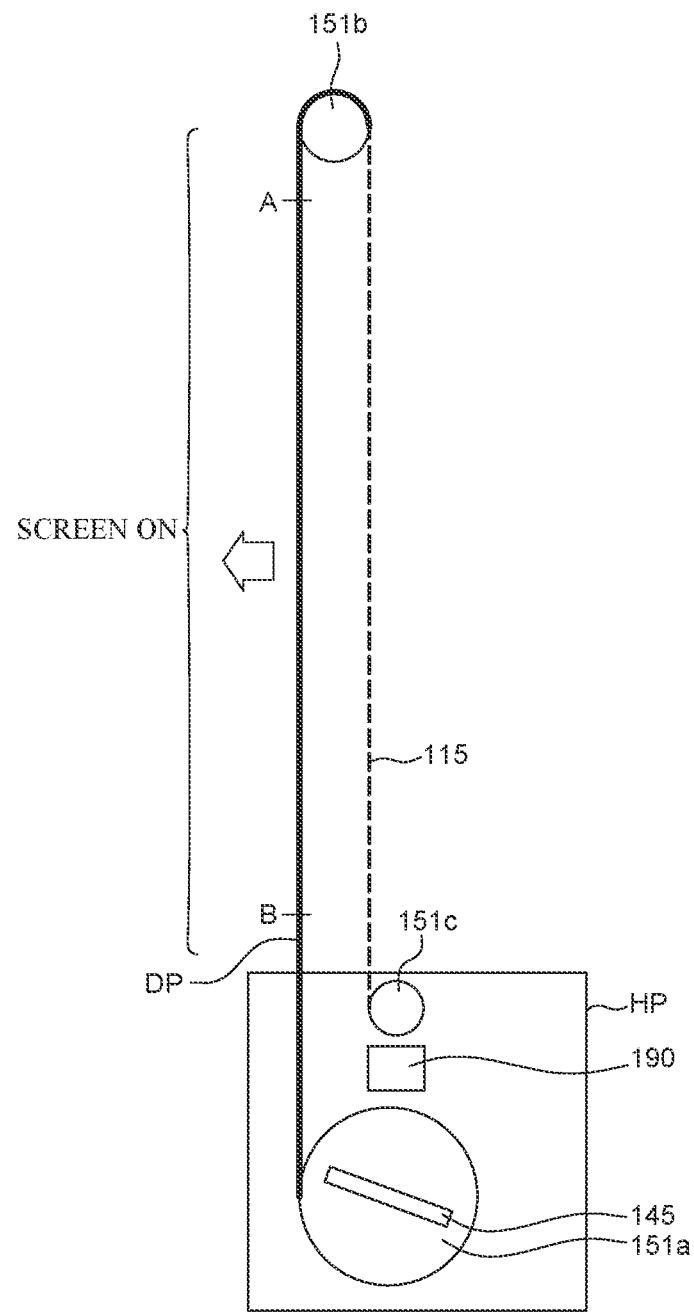
FIGS. 10A and 10B are cross-sectional views illustrating an example of a full view in a display device according to the first exemplary embodiment of the present disclosure.
Figure 10B:
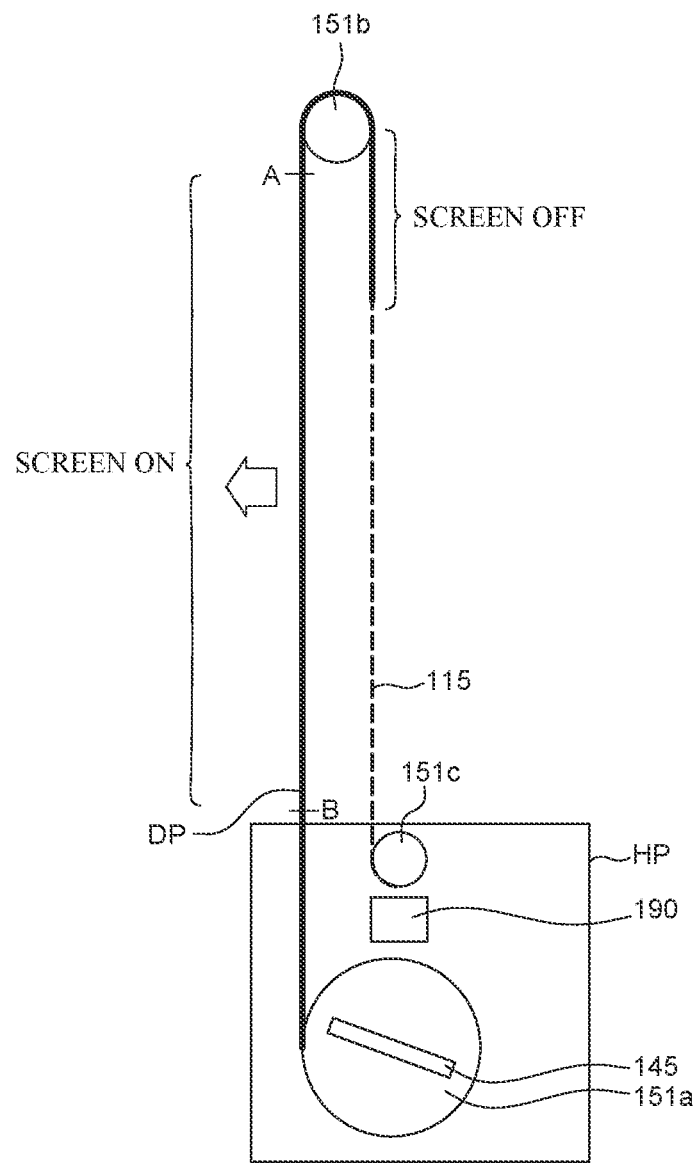

FIGS. 10A and 10B are cross-sectional views illustrating an example of a full view in a display device according to the first exemplary embodiment of the present disclosure.

A difference between the display device of FIGS. 10A and 10B and the display device of FIGS. 8A and 8B is a total height of the watching area, and other configurations are substantially the same so that a redundant description will be omitted or may be briefly provided. The same configuration will be denoted with the same reference numeral.

Referential symbols A and B illustrated in FIGS. 10A and 10B denote an upper end and a lower end of the display area of the display panel, respectively.

FIG. 10A illustrates a basic type of a full view as an example and FIG. 10B illustrates a modified shape of a full view in which a watching area moves.

Referring to FIG. 10A, as illustrated in FIG. 8A, the first motor is driven to lift the lifting unit and the second motor 190 is driven to wind the extending sheets 115 around the third roller 151c to lift and lower the display unit DP.

At this time, the display unit DP is lifted to the maximum to expose the entire display area (from A to B in FIG. 10A).

In this state, when the first motor is turned off, a total height of the watching area is constantly maintained and the corresponding display area is driven (ON) to watch the image in the entire display area. For example, an area from the upper end A to the lower end B of the display area is an actual watching area and has an aspect ratio of 16:9.

In the meantime, referring to FIG. 10B, the first motor and the second motor 190 are driven to change the height of the second roller 151b and the watching area. For example, the first motor is driven to lower the height of the second roller 151b and the second motor 190 is driven to roll the third roller 151c so that the extending sheet 115 is wound around the third roller 151c to adjust the entire display area to serve as an actual watching area. Therefore, an unnecessary area is screen-off to improve the lifespan.

According to the first exemplary embodiment of the present disclosure, the housing unit includes one opening, but is not limited thereto so that two openings are provided to move the display unit and the extending sheet in the vertical direction, respectively, which will be described in more detail with reference to a second exemplary embodiment of the present disclosure.

Second Embodiment

Figure 11A:
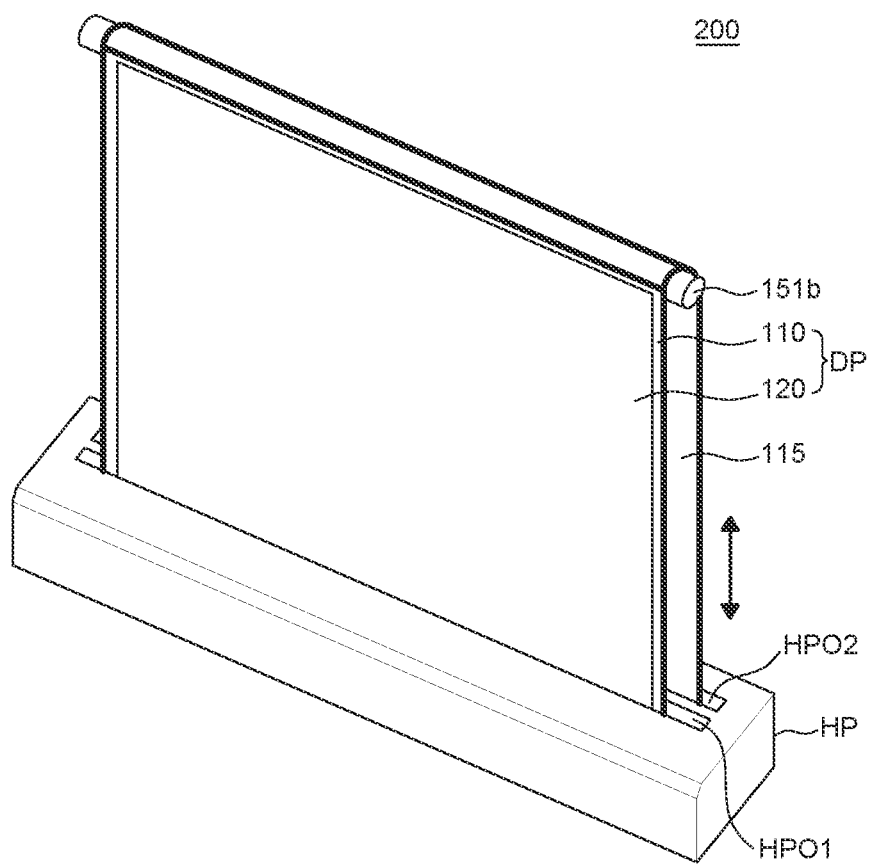
FIGS. 11A and 11B are perspective views of a display device according to a second exemplary embodiment of the present disclosure.
Figure 11B:
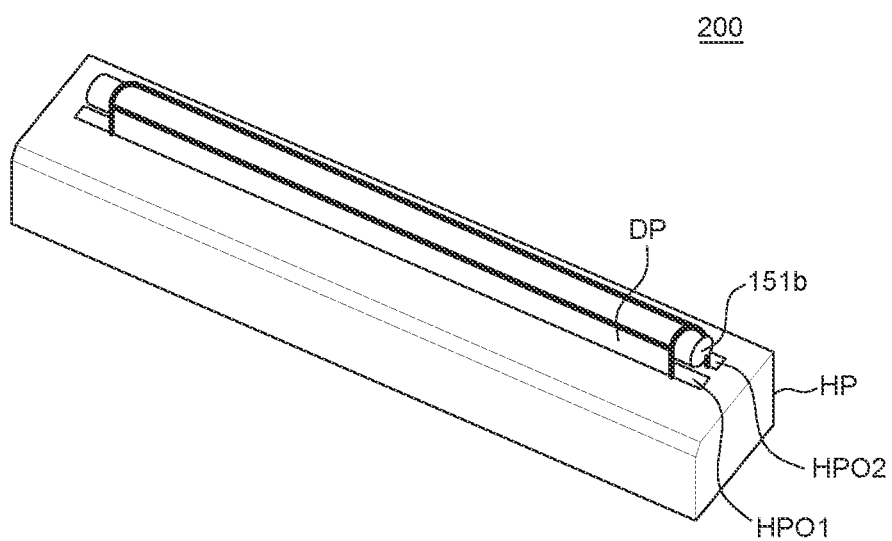

FIGS. 11A and 11B are perspective views of a display device according to a second exemplary embodiment of the present disclosure.

Figure 12A:
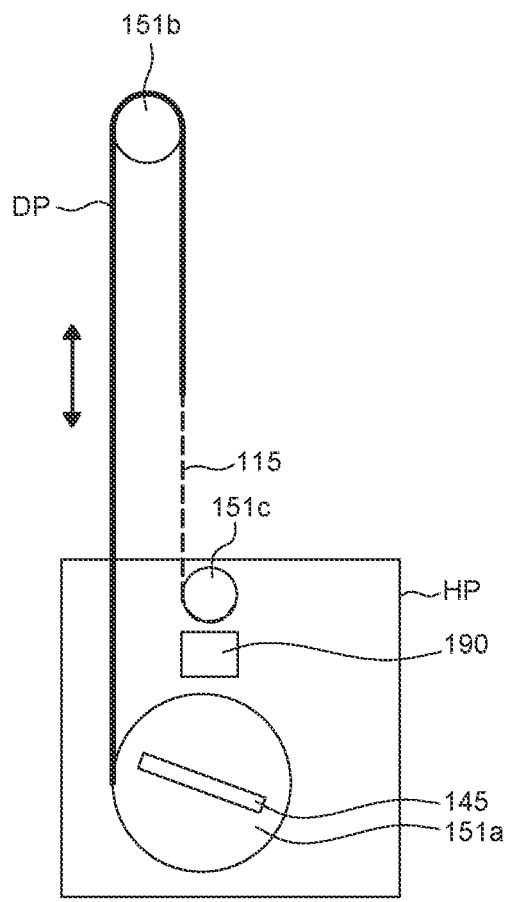
FIGS. 12A and 12B are schematic cross-sectional views of a display device according to the second exemplary embodiment of the present disclosure.
Figure 12B:
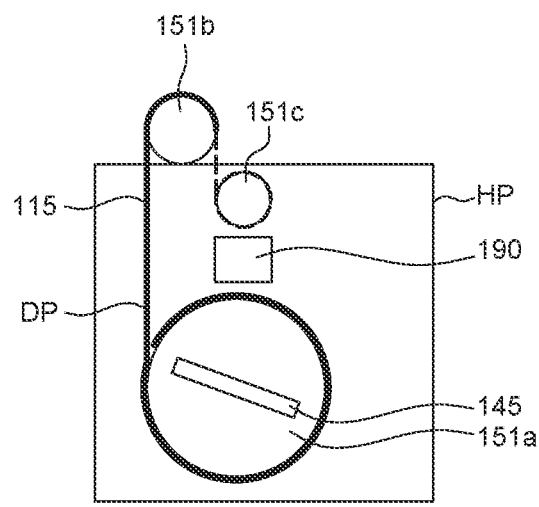

FIGS. 12A and 12B are schematic cross-sectional views of a display device according to the second exemplary embodiment of the present disclosure.

A difference between a display device 200 according to the second exemplary embodiment of the present disclosure of FIGS. 11A, 11B, 12A, and 12B and the display device 100 of FIGS. 1A, 1B, 2A, and 2B is a configuration of openings HPO1 and HPO2 of the housing unit HP. Other configurations are substantially the same, so that a redundant description will be omitted or may be briefly provided. The same configuration will be denoted with the same reference numeral.

Referring to FIGS. 11A, 11B, 12A, and 12B, the display device 200 according to the second exemplary embodiment of the present disclosure can include a display unit DP and a housing unit HP.

The display device 200 according to the second exemplary embodiment of the present disclosure includes a second roller 151b and a third roller 151c in addition to a main roller, for example, a first roller 151a. However, it is not limited thereto and the display device may not include the third roller 151c.

At this time, the display device 200 according to the second exemplary embodiment of the present disclosure includes two openings HPO1 and HPO2 so that the display unit DP and the extending sheet 115 move in the vertical direction, respectively.

For example, the openings HPO1 and HPO2 according to the second exemplary embodiment of the present disclosure can include a first opening HPO1 through which the display unit DP moves in the vertical direction and a second opening HPO2 through which the extending sheet 115 moves in the vertical direction.

In this case, as illustrated in FIG. 12B, the extending sheet 115 and a part of the driving unit including the second roller 151b can be located at the outside of the housing unit HP. Further, according to the second exemplary embodiment of the present disclosure, the movement of the display unit DP and the extending sheet 115 is guided by means of the first opening HPO1 and the second opening HPO2 so that the driving can be more smoothly performed.

In the meantime, in the first and second exemplary embodiments of the present disclosure, three rollers are provided, but is not limited thereto so that the third roller is omitted and only two rollers can be provided, which will be described in detail with reference to a third exemplary embodiment of the present disclosure.

Third Embodiment

Figure 13:
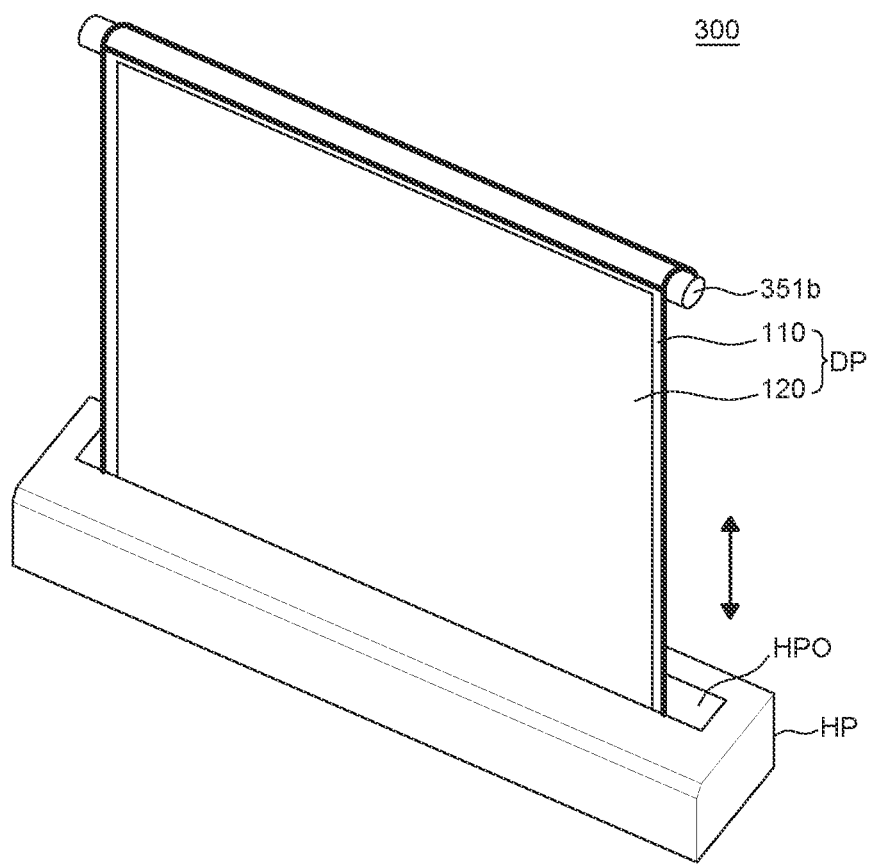
FIG. 13 is a perspective view of a display device according to a third exemplary embodiment of the present disclosure.

FIG. 13 is a perspective view of a display device according to a third exemplary embodiment of the present disclosure.

Figure 14A:
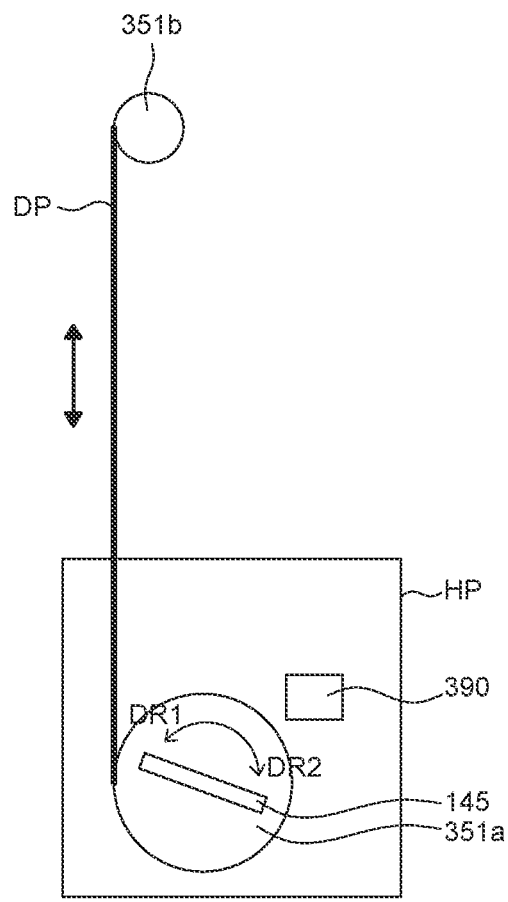
FIGS. 14A and 14B are schematic cross-sectional views of a display device according to the third exemplary embodiment of the present disclosure.
Figure 14B:
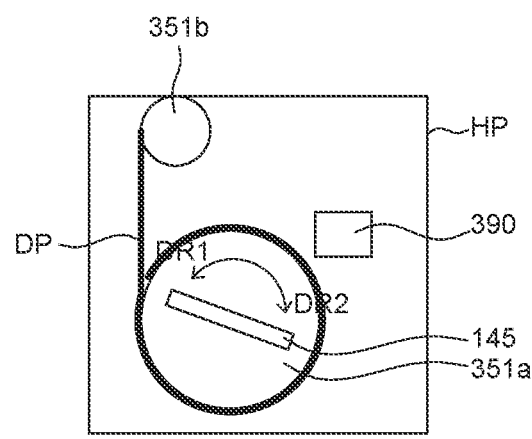

FIGS. 14A and 14B are schematic cross-sectional views of a display device according to the third exemplary embodiment of the present disclosure.

Figure 15:
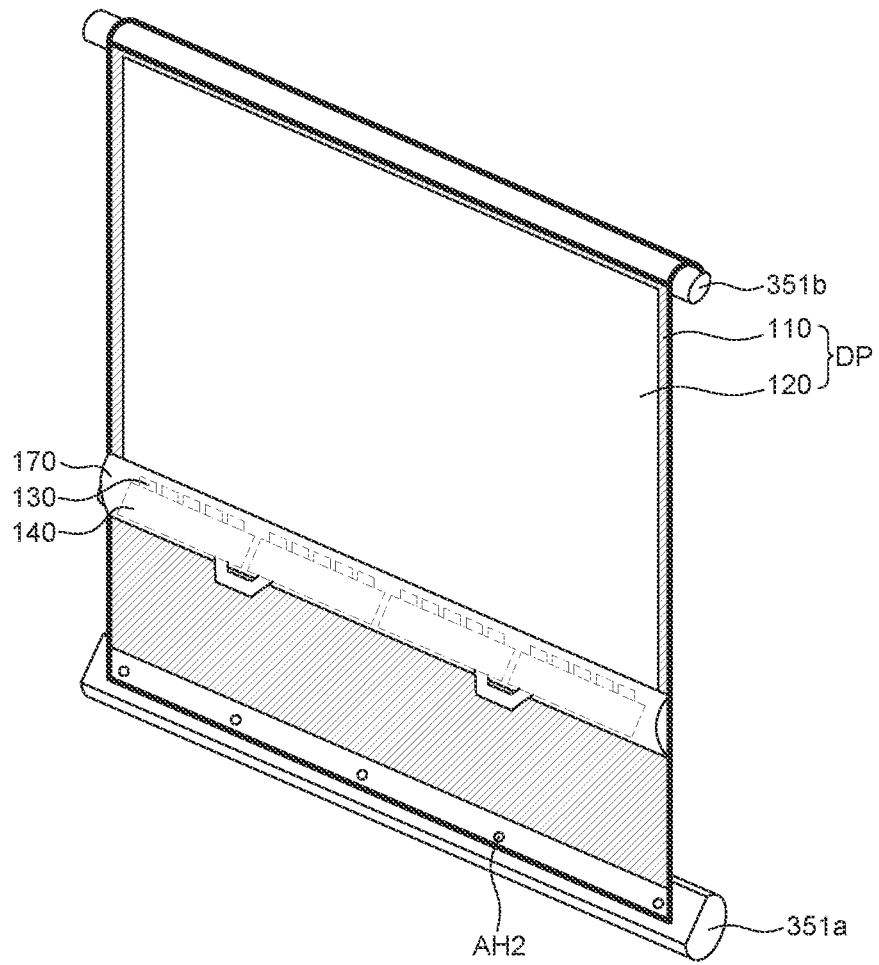
FIG. 15 is a perspective view of a display device according to the third exemplary embodiment of the present disclosure.

FIG. 15 is a perspective view of a display device according to the third exemplary embodiment of the present disclosure.

Figure 16A:
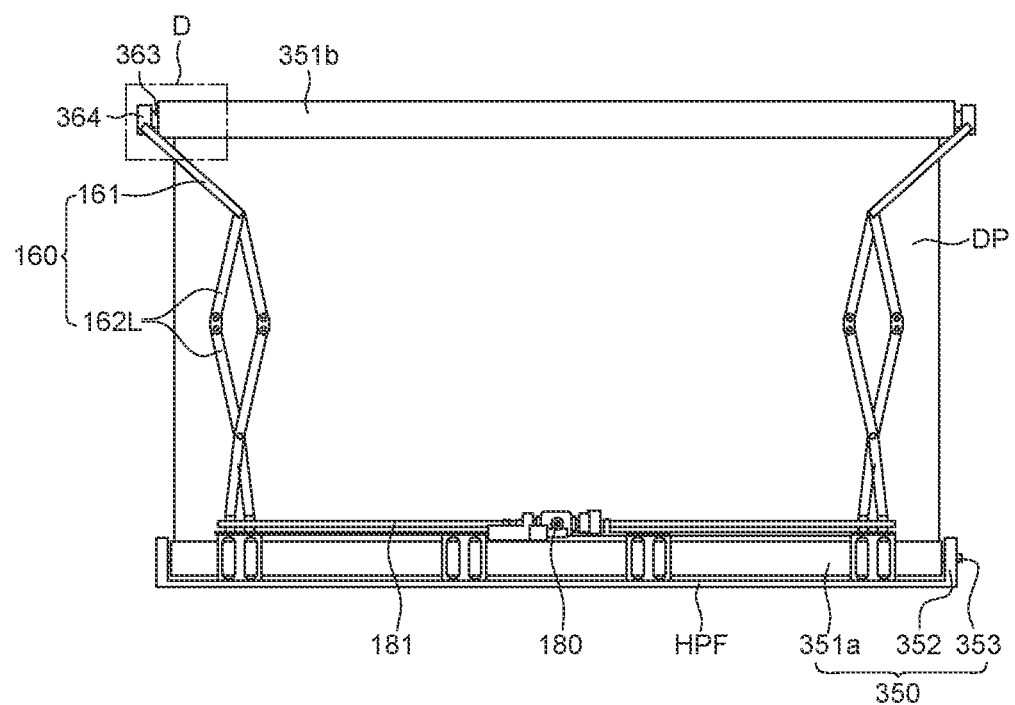
FIG. 16A is a rear view of a display device according to the third exemplary embodiment of the present disclosure.

FIG. 16A is a rear view of a display device according to the third exemplary embodiment of the present disclosure.

Figure 16B:
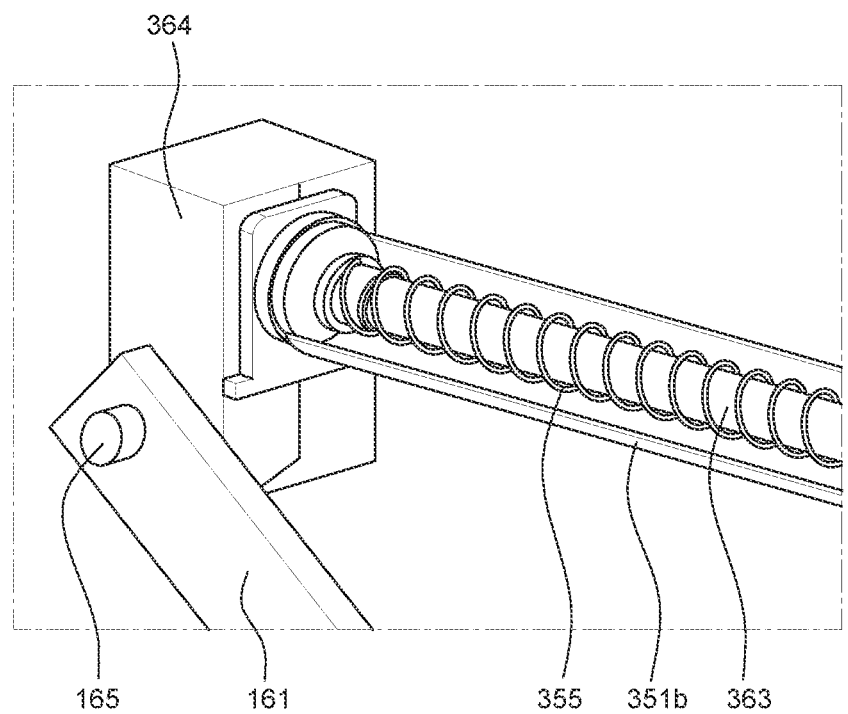
FIG. 16B is an enlarged view of an area D of FIG. 16A.

FIG. 16B is an enlarged view of an area D of FIG. 16A.

Figure 17A:
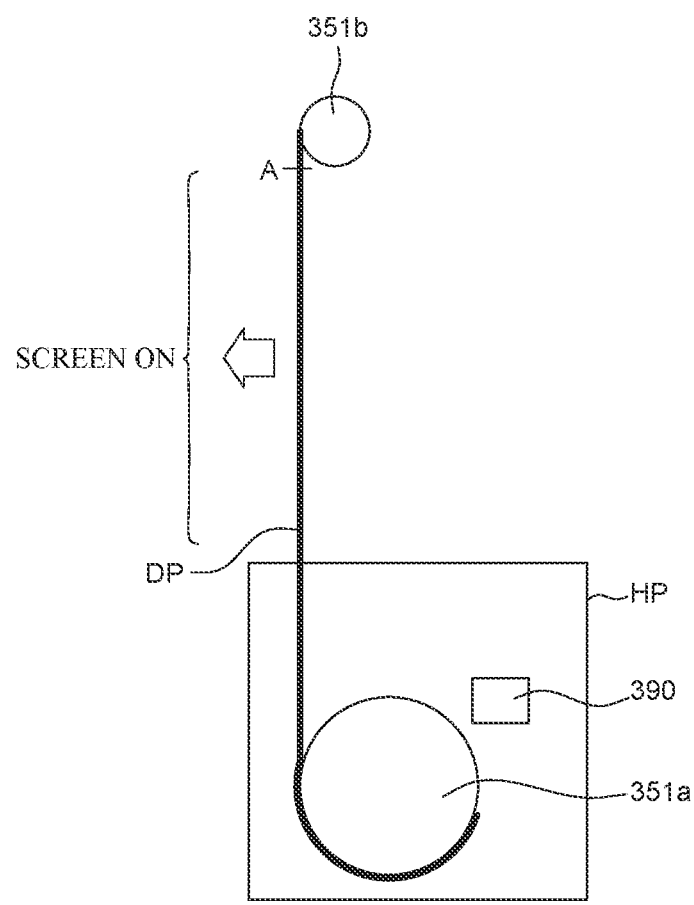
FIGS. 17A and 17B are cross-sectional views illustrating an example of a partial view in a display device according to the third exemplary embodiment of the present disclosure.
Figure 17B:
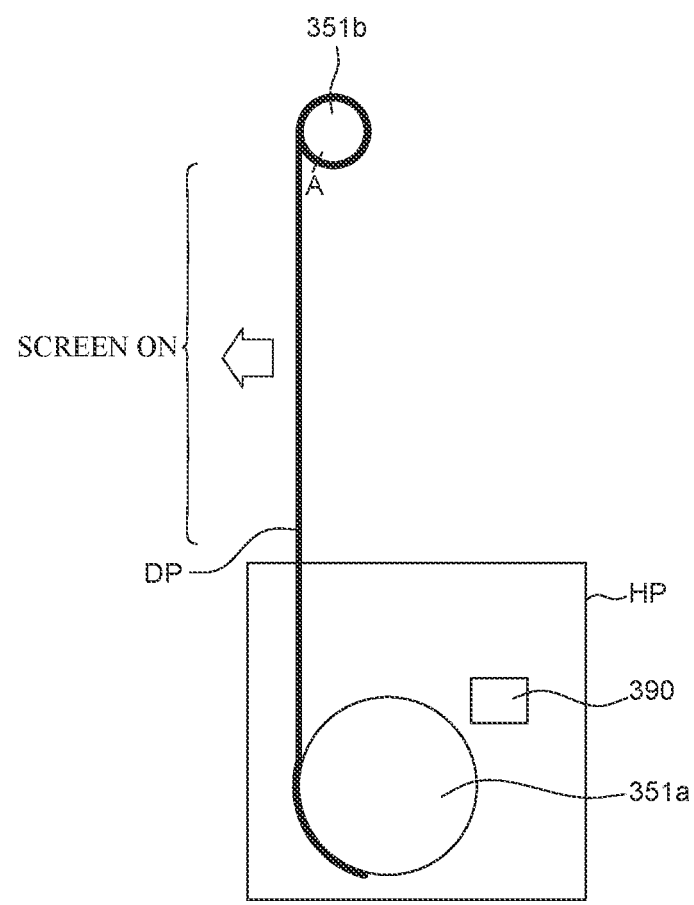

FIGS. 17A and 17B are cross-sectional views illustrating an example of a partial view in a display device according to the third exemplary embodiment of the present disclosure.

A difference between a display device 300 of FIGS. 13 to 17B and the display device 100 of FIGS. 1A and 1B to 10A and 10B is the configuration of rollers 351a and 351b. Other configurations are substantially the same so that a redundant description will be omitted or may be briefly provided. The same configuration will be denoted with the same reference numeral.

FIGS. 14A and 14B are schematic cross-sectional views for explaining a first roller 351a and a second roller 315b in the display device 300 according to the third exemplary embodiment of the present disclosure. However, the present disclosure is not limited to the structure illustrated in FIGS. 14A and 14B.

Further, for the convenience of description, a configuration of the driving unit is omitted in FIG. 15.

Referring to FIGS. 13 to 16B, the display device 300 according to the third exemplary embodiment of the present disclosure can include a display unit DP and a housing unit HP.

The display unit DP is a configuration to display images to the user and can be formed of a display panel 120 and a back cover 110 each having a flexibility to be wound or unwound.

The display unit DP can include a back cover 110, a display panel 120, a flexible film 130, and a printed circuit board 140.

In the meantime, the display device 300 according to the third exemplary embodiment of the present disclosure can perform a partial view that only a partial area of the display panel 120 emits light to be utilized as a display area.

To this end, the display device 300 according to the third exemplary embodiment of the present disclosure includes a second roller 351b in addition to a main roller, for example, a first roller 351a.

The housing unit HP is a case in which the display unit DP is accommodated.

The housing unit HP can have an opening HPO through which the display unit DP and the second roller 351*b* move to the inside and the outside of the housing unit HP.

As described above, the display unit DP can include a back cover 110, a display panel 120, a flexible film 130, and a printed circuit board 140.

Further, the driving unit for driving the display unit DP can be configured to include a roller unit 350 and a lifting unit 160.

The roller unit 350 can include a first roller 351*a*, a roller support unit 352, and a first rotary shaft 353.

The roller unit 350 can be provided in the housing unit HP.

The first roller 351*a* can include a source printed circuit board 145 therein, but is not limited thereto.

The first roller 351*a* is a member around which the display unit DP is wound. The first roller 351*a* can be, for example, formed to have a cylindrical shape. Specifically, referring to FIG. 15, the first roller 351*a* of the present disclosure has a D-cut shape in which a part of a cylindrical shape has a flat shape, but is not limited thereto.

The lower edge of the back cover 110 can be fixed to the first roller 351*a*. For example, a screw passes through the second fastening hole AH2 so that the lower edge of the back cover 110 can be fastened with the first roller 351*a*, but is not limited thereto.

The roller support unit 352 can support the first roller 351*a* at both sides of the first roller 351*a*. Specifically, the roller support unit 352 can be disposed on a bottom surface HPF of the housing unit HP. Upper side surfaces of the roller support unit 352 can be coupled to both ends of the first roller 351*a*. The first roller 351*a* can be rotatably coupled to the roller support unit 352. Therefore, the first roller 351*a* can rotate around the first rotary shaft 353 in the first direction DR1 or the second direction DR2.

The first roller 351*a* can be rotated by the driving of the second motor 390. The first roller 351*a* is connected to the second motor 390 by means of a gear to rotate, but is not limited thereto. The display unit DP can be wound or unwound by the rotation of the first roller 351*a*.

At this time, when the first roller 351*a* rotates in a first direction DR1, for example, a counterclockwise direction, the back cover 110 fixed to the first roller 351*a* through the lower edge can be wound around the first roller 351*a*. In contrast, when the first roller 351*a* rotates in a second direction DR2 which is an opposite direction, for example, a clockwise direction, the back cover 110 wound around the first roller 351*a* can be unwound from the first roller 351*a*.

The driving unit of the third exemplary embodiment of the present disclosure can further include a second roller 351*b*.

The third exemplary embodiment of the present disclosure includes a second roller 351*b* at the outside of the housing unit HP, in addition to the first roller 351*a*. For example, according to the third exemplary embodiment of the present disclosure, in order to drive the display unit DP, two rollers including the first roller 351*a* and the second roller 351*b*, two motors including a first motor 180 and a second motor 390, and one torsion spring 355 installed in the second roller 351*b* can be provided.

The position of the emission area of the display panel 120 can be flexibly adjusted by the vertical movement of the second roller 351*b* and the rolling of the display unit DP by the torsion spring 355 so that the partial view is possible without causing the burn-in issue.

The display unit DP can be wound around the second roller 351*b*.

As described above, the position of the emission area of the display panel 120 can be adjusted in accordance with a rotation state of the first roller 351*a* and a lifted height of the second roller 351*b*.

The driving unit can further include the first motor 180 and a driving shaft 181.

The first motor 180 can include a gear box, but is not limited thereto.

The driving of the first motor 180 can be transmitted to the lifting unit 160 by means of the driving shaft 181. A plurality of links 162L of the lifting unit 160 is upwardly unfolded by the driving of the first motor 180 to push up the second roller 351*b* fastened with the roller lifting unit 161 and thus, the display unit DP can be upwardly driven. A specific configuration of the lifting unit 160 is substantially the same as the first exemplary embodiment of the present disclosure described above.

One end of the roller lifting unit 161 is hinged with one end of the link 162L and the other end can be rotatably fastened with the fastening unit 364 connected to a second rotary shaft 363. The second roller 351*b* is axially coupled to the second rotary shaft 363 and the second rotary shaft 363 can be fastened with the fastening unit 364. The roller lifting unit 161 can be rotatably fastened with the fastening unit 364 by means of a hinge rotation bush 165, but is not limited thereto. Therefore, the roller lifting unit 161 is lifted or lowered to lift or lower the second roller 351*b* fastened with the fastening unit 364. By doing this, the display unit DP can be lifted or lowered.

In the meantime, the torsion spring 355 can be installed in the second roller 351*b* to be wound around the second rotary shaft 363, but is not limited thereto. The torsion spring 355 pulls up the display unit DP at all times so that the display unit DP can be wound around the second roller 351*b*.

In some exemplary embodiments, a driving unit having a structure other than the above-described driving unit can be applied to the display device 300. For example, as long as the display unit DP is wound and unwound, the above-described configuration of the roller unit 350 and the lifting unit 160 can be modified, some configurations can be omitted, or another configuration can be added.

FIGS. 17A and 17B are cross-sectional views illustrating an example of a partial view in a display device according to the third exemplary embodiment of the present disclosure.

The reference symbol A illustrated in FIGS. 17A and 17B denotes an upper end of the display area. A screen ON illustrated in FIGS. 17A and 17B indicates that a signal is applied to a corresponding display panel to display images.

FIG. 17A illustrates a basic type of a partial view as an example and FIG. 17B illustrates a modified shape of a partial view in which a watching area moves. Here, the watching area refers to a display area in the screen ON.

Referring to FIG. 17A, in the display device according to the third exemplary embodiment of the present disclosure, the display unit DP can be lifted or lowered by means of the first motor and the second motor 390.

For example, the first motor and the second motor 390 are controlled to lift or lower the display unit DP and change the watching area.

As described above, when the first motor is driven (ON), the plurality of links of the lifting unit is upwardly unfolded to push up the second roller 351*b* fastened with the lifting unit and thus, the display unit DP can be upwardly driven. When the display unit DP is lifted to a predetermined height and the first motor is turned off, a total height of the watching area is constantly maintained and the corresponding display area is driven (ON) to watch the image.

In the meantime, referring to FIG. 17B, when the second motor 390 is driven in this state, the watching area can be changed. For example, the second motor 390 is driven to release the lower end of the display unit DP to be longer, the upper end of the display unit DP can be wound around the second roller 351b by an elastic force of the torsion spring installed in the second roller 351b. By doing this, the watching area is moved and the emission area can be flexibly adjusted. Therefore, the burn-in phenomenon is suppressed to improve the lifespan.

The exemplary embodiments of the present disclosure can also be described as follows:

According to an aspect of the present disclosure, there is provided a display device. The display device includes a display panel having a display area, a back cover disposed on a rear surface of the display panel, a first roller which winds or unwinds the back cover and the display panel and a second roller which is disposed above the first roller to move in a vertical direction, the back cover and the display panel being overlaid thereon.

The display device can further include an extending sheet which can be fastened with an upper end of the back cover, wherein a lower end of the back cover can be fastened with the first roller.

The display device can further include an extending sheet which can be disposed on a rear surface of the back cover and can have a lower end fastened with the first roller.

The display device can further include a housing unit which can accommodate the first roller, wherein the housing unit can include an opening through which the back cover and the display panel can move to an outside and an inside of the housing unit.

The opening includes a first opening through which the back cover and the display panel can move in a vertical direction and a second opening through which the extending sheet can move in the vertical direction.

The display device can further include a third roller disposed in the housing unit, wherein an upper end of the extending sheet can be fastened with the third roller.

The display device can further include a first rotary shaft which can be axially coupled to the first roller, a roller support unit which can be provided on both sides of the first roller and can be rotatably coupled to the first rotary shaft and a torsion spring which can be wound around the first rotary shaft to be installed in the first roller.

The display device can further include a first motor disposed on one side of the first roller and a driving shaft which can be coupled to the first motor.

The display device can further include a plurality of links which can be disposed on the rear surface of the back cover and can be hinged with each other and a roller lifting unit which can be coupled to an end of the link, wherein the plurality of links can be connected to the driving shaft through the other end of the link to be lifted and lowered in the vertical direction in accordance with driving of the first motor.

The display device can further include a second rotary shaft which can be axially coupled to the second roller and a fastening unit which can be connected to an end of the second rotary shaft, wherein the roller lifting unit can be rotatably fastened with the fastening unit.

The display device can further include a second motor which can rotate the third roller, wherein the extending sheet can be wound around or unwound from the third roller by rotation of the third roller.

According to another aspect of the present disclosure, there is provided a display device. The display device includes a display panel having a display area, a back cover disposed on a rear surface of the display panel, a first roller which is connected to a lower end of the back cover to wind or unwind the back cover and the display panel and a second roller which is disposed above the first roller to move in a vertical direction and is fastened with an upper end of the back cover.

The display device can further include a first motor disposed on one side of the first roller, a driving shaft coupled to the first motor and a second motor which rotates the first roller.

The display device can further include a plurality of links which can be disposed on a rear surface of the back cover and can be hinged with each other and a roller lifting unit which can be coupled to an end of the link, wherein the plurality of links can be connected to the driving shaft through the other end of the link to be lifted and lowered in the vertical direction in accordance with driving of the first motor.

The display device can further include a second rotary shaft which can be axially coupled to the second roller, a fastening unit which can be connected to an end of the second rotary shaft and a torsion spring which can be wound around the second rotary shaft to be installed in the second roller, wherein the roller lifting unit can be rotatably fastened with the fastening unit.

According to still another aspect of the present disclosure, there is provided a display device. The display device includes a display panel having a display area, a back cover disposed on a rear surface of the display panel, a first roller which is disposed in a housing unit and winds or unwinds the back cover and the display panel, a second roller which is disposed above the first roller to move in a vertical direction, the back cover and the display panel being overlaid thereon, a third roller disposed in the housing unit and an extending sheet which is disposed at an upper end of the back cover or a rear surface of the back cover and is fastened with the third roller through an upper end.

The display device can further include a first motor which can be disposed at one side of the first roller and lifts and lowers the back cover and the display panel and a second motor which can rotate the third roller.

After lifting the back cover and the display panel by driving the first motor and winding the extending sheet around the third roller by driving the second motor, the first motor can be turned off to constantly maintain a height of a watching area (a display area in which a screen can be driven in the display area) to display images.

In a state in which the first motor can be turned off, the second motor can be driven and the third roller can be rolled to move the watching area.

The extending sheet can be wound around the third roller to locate an upper end of the display area to be close to the third roller and the first motor can be turned off and the watching area can be driven on a front surface and a rear surface of the display device to display images.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto.

Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
   a display panel having a display area;
   a back cover disposed on a rear surface of the display panel and having a plurality of openings;
   a first roller which winds or unwinds the back cover and the display panel;
   a housing unit which accommodates the first roller,
   wherein the housing unit includes an opening through which the back cover and the display panel moves to an outside and an inside of the housing unit;
   a first motor disposed on one side of the first roller;
   a driving shaft which is coupled to the first motor; and
      a second roller which is disposed above the first roller to move in a vertical direction, the back cover and the display panel being overlaid on the second roller, the second roller moves to the inside and the outside of the housing unit,
   wherein the first motor is disposed between the first roller and the second roller.

2. The display device according to claim 1, further comprising:
   an extending sheet which is fastened with an upper end of the back cover,
   wherein a lower end of the back cover is fastened with the first roller.

3. The display device according to claim 1, further comprising:
   an extending sheet which is disposed on a rear surface of the back cover and has a lower end fastened with the first roller.

4. The display device according to claim 2, wherein the opening of the housing unit includes:
   a first opening through which the back cover and the display panel move in a vertical direction; and
   a second opening through which the extending sheet moves in the vertical direction.

5. The display device according to claim 2, further comprising:
   a third roller disposed in the housing unit,
   wherein an upper end of the extending sheet is fastened with the third roller.

6. The display device according to claim 2, further comprising:
   a first rotary shaft which is axially coupled to the first roller;
   a roller support unit which is provided on sides of the first roller and is rotatably coupled to the first rotary shaft; and
   a torsion spring which is wound around the first rotary shaft to be installed in the first roller.

7. The display device according to claim 2, further comprising:
   a plurality of links which is disposed on the rear surface of the back cover and is hinged with each other; and
   a roller lifting unit which is coupled to an end of one link among the plurality of links,
   wherein the plurality of links is connected to the driving shaft through another end of the one link to be lifted and lowered in the vertical direction in accordance with driving of the first motor.

8. The display device according to claim 7, further comprising:
   a second rotary shaft which is axially coupled to the second roller; and
   a fastening unit which is connected to an end of the second rotary shaft,
   wherein the roller lifting unit is rotatably fastened with the fastening unit.

9. The display device according to claim 5, further comprising:
   a second motor which rotates the third roller,
   wherein the extending sheet is wound around or unwound from the third roller by rotation of the third roller.

10. A display device, comprising:
    a display panel having a display area;
    a back cover disposed on a rear surface of the display panel and having a plurality of openings;
    a first roller which is connected to a lower end of the back cover to wind or unwind the back cover and the display panel;
    a housing unit which accommodates the first roller,
    wherein the housing unit includes an opening through which the back cover and the display panel moves to an outside and an inside of the housing unit,
    a first motor disposed on one side of the first roller;
    a driving shaft coupled to the first motor;
    a second motor which rotates the first roller; and
       a second roller which is disposed above the first roller to move in a vertical direction and is fastened with an upper end of the back cover, the second roller moves to the inside and the outside of the housing unit,
    wherein the first motor is disposed between the first roller and the second roller.

11. The display device according to claim 10, further comprising:
    a plurality of links which is disposed on a rear surface of the back cover and is hinged with each other; and
    a roller lifting unit which is coupled to an end of the link,
    wherein the plurality of links is connected to the driving shaft through another end of the link to be lifted and lowered in the vertical direction in accordance with driving of the first motor.

12. The display device according to claim 11, further comprising:
    a second rotary shaft which is axially coupled to the second roller;
    a fastening unit which is connected to an end of the second rotary shaft; and
    a torsion spring which is wound around the second rotary shaft to be installed in the second roller,
    wherein the roller lifting unit is rotatably fastened with the fastening unit.

13. A display device, comprising:
    a display panel having a display area;
    a back cover disposed on a rear surface of the display panel and having a plurality of openings;
    a first roller which is disposed in a housing unit and winds or unwinds the back cover and the display panel;
    wherein the housing unit includes an opening through which the back cover and the display panel moves to an outside and an inside of the housing unit,
    a first motor which is disposed at one side of the first roller and lifts and lowers the back cover and the display panel;

a second roller which is disposed above the first roller to move in a vertical direction, the back cover and the display panel being overlaid on the second roller, the second roller moves to the inside and the outside of the housing unit;

a third roller disposed in the housing unit;

a second motor which rotates the third roller, wherein the second motor is disposed between the first rover and the third rover; and an extending sheet which is disposed at an upper end of the back cover or a rear surface of the back cover and is fastened with the third roller through an upper end.

14. The display device according to claim 13, wherein after lifting the back cover and the display panel by driving the first motor and winding the extending sheet around the third roller by driving the second motor, the first motor is turned off to constantly maintain a height of a watching area in the display area to display images.

15. The display device according to claim 14, wherein in a state in which the first motor is turned off, the second motor is driven and the third roller is rolled to move the watching area.

16. The display device according to claim 13, wherein the extending sheet is wound around the third roller to locate an upper end of the display area to be close to the third roller, and the first motor is turned off and the watching area is driven on a front surface and a rear surface of the display device to display images.

* * * * *